(12) United States Patent
Nanami et al.

(10) Patent No.: US 10,930,673 B2
(45) Date of Patent: Feb. 23, 2021

(54) SEMICONDUCTOR STORAGE DEVICE AND METHOD FOR MANUFACTURING SEMICONDUCTOR STORAGE DEVICE

(71) Applicant: TOSHIBA MEMORY CORPORATION, Minato-ku (JP)

(72) Inventors: Kyosuke Nanami, Yokkaichi (JP); Kenichi Fujii, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 15 days.

(21) Appl. No.: 16/561,823

(22) Filed: Sep. 5, 2019

(65) Prior Publication Data

US 2020/0286912 A1    Sep. 10, 2020

(30) Foreign Application Priority Data

Mar. 4, 2019   (JP) .............................. JP2019-038626

(51) Int. Cl.

| | |
|---|---|
| *H01L 27/11582* | (2017.01) |
| *H01L 27/11524* | (2017.01) |
| *H01L 27/11556* | (2017.01) |
| *H01L 21/768* | (2006.01) |
| *H01L 23/528* | (2006.01) |
| *H01L 23/522* | (2006.01) |
| *H01L 27/1157* | (2017.01) |

(52) U.S. Cl.
CPC .. *H01L 27/11582* (2013.01); *H01L 21/76816* (2013.01); *H01L 21/76877* (2013.01); *H01L 23/5226* (2013.01); *H01L 23/5283* (2013.01); *H01L 27/1157* (2013.01); *H01L 27/11524* (2013.01); *H01L 27/11556* (2013.01)

(58) Field of Classification Search
CPC combination set(s) only.
See application file for complete search history.

(56) References Cited

U.S. PATENT DOCUMENTS

| | | | |
|---|---|---|---|
| 8,822,285 B2 * | 9/2014 | Hwang | ............. H01L 27/11582 438/257 |
| 9,985,041 B2 | 5/2018 | Yun et al. | |
| 10,141,372 B2 | 11/2018 | Park et al. | |
| 10,734,400 B1 * | 8/2020 | Fukuo | ................. H01L 23/5329 |
| 2017/0077027 A1 * | 3/2017 | Shimizu | ............. H01L 27/1157 |

(Continued)

FOREIGN PATENT DOCUMENTS

JP     2019-201038 A     11/2019

*Primary Examiner* — Mamadou L Diallo
(74) *Attorney, Agent, or Firm* — Oblon, McClelland, Maier & Neustadt, L.L.P.

(57) ABSTRACT

According to one embodiment, a semiconductor storage device includes: a first stair portion which descends in a second direction that is a direction away from a pillar, and has a plurality of steps; and a third stair portion which is provided to face the first stair portion, and ascends in the second direction, and has a plurality of steps. A distance from an upper end of an uppermost step surface of the first stair portion to an upper end of a lowermost step surface of the first stair portion at a position identical to the upper end in the third direction is longer than a distance from an upper end of an uppermost step surface of the third stair portion to an upper end of a lowermost step surface of the third stair portion at a position identical to the upper end in the third direction.

20 Claims, 29 Drawing Sheets

(56) References Cited

U.S. PATENT DOCUMENTS

2017/0236746 A1* 8/2017 Yu ..................... H01L 27/11582
                                                    257/314
2017/0271348 A1* 9/2017 Arai .................. H01L 29/40114
2019/0348430 A1  11/2019 Yanai

* cited by examiner

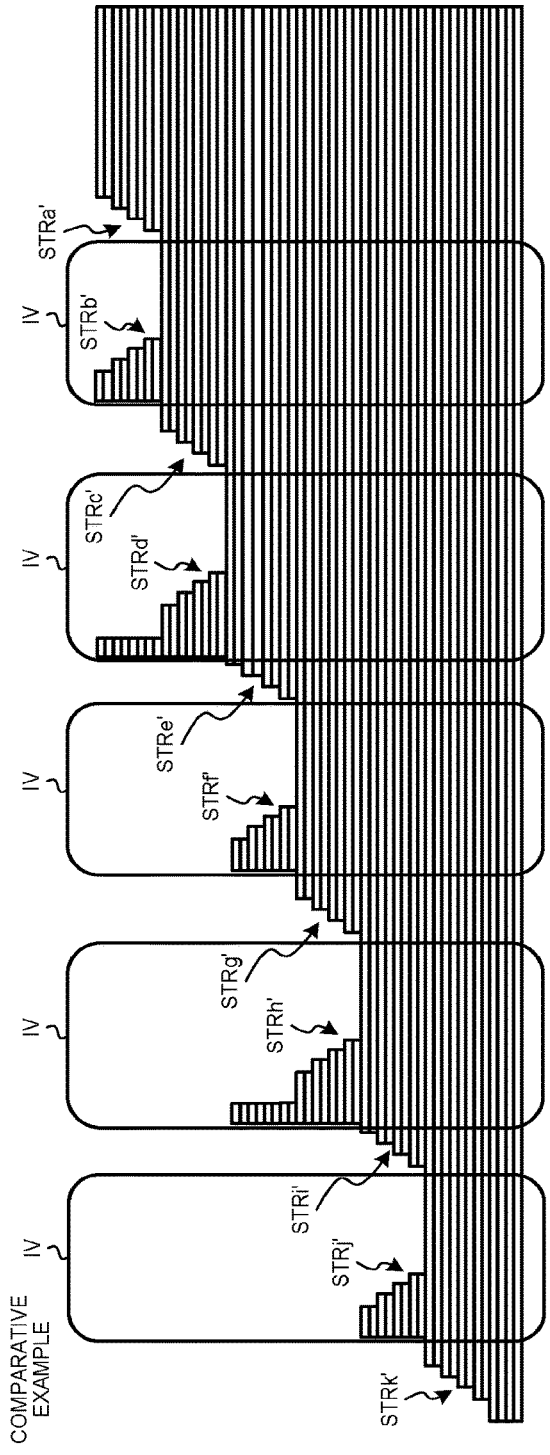
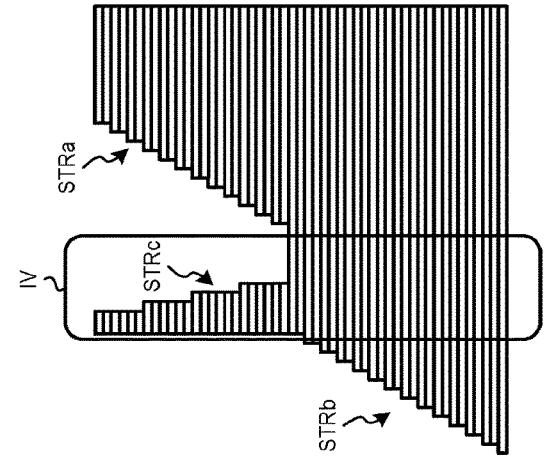
FIG.15A COMPARATIVE EXAMPLE
FIG.15B EMBODIMENT

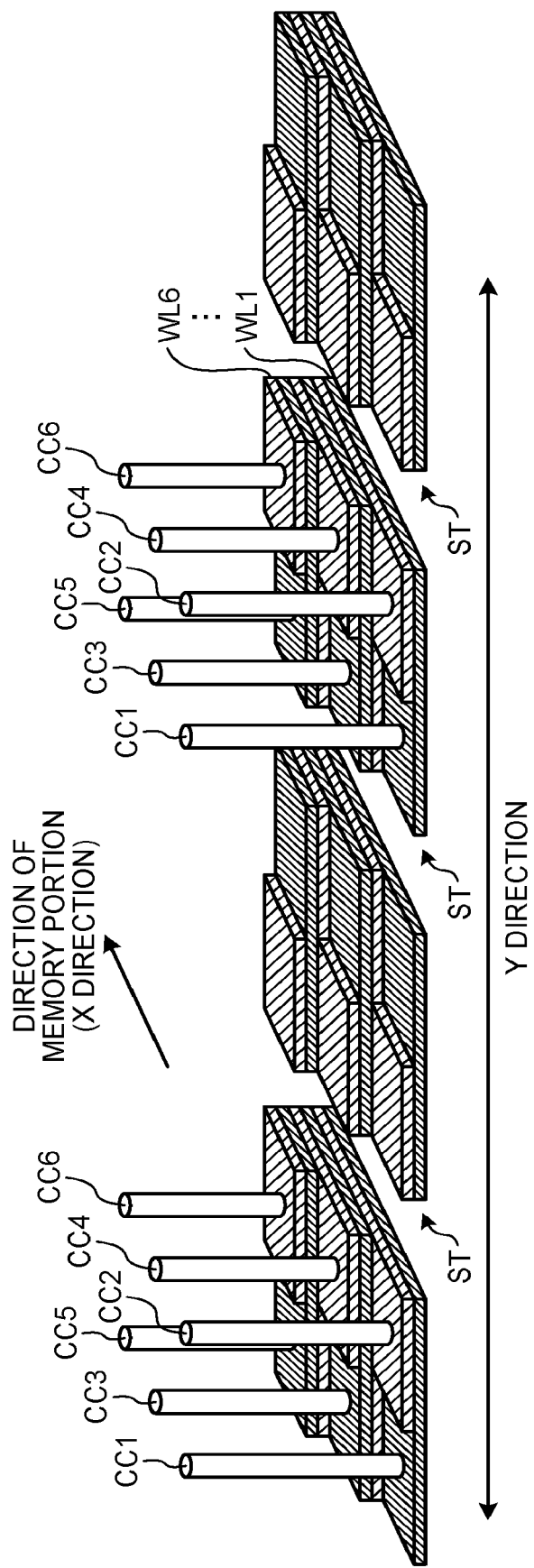

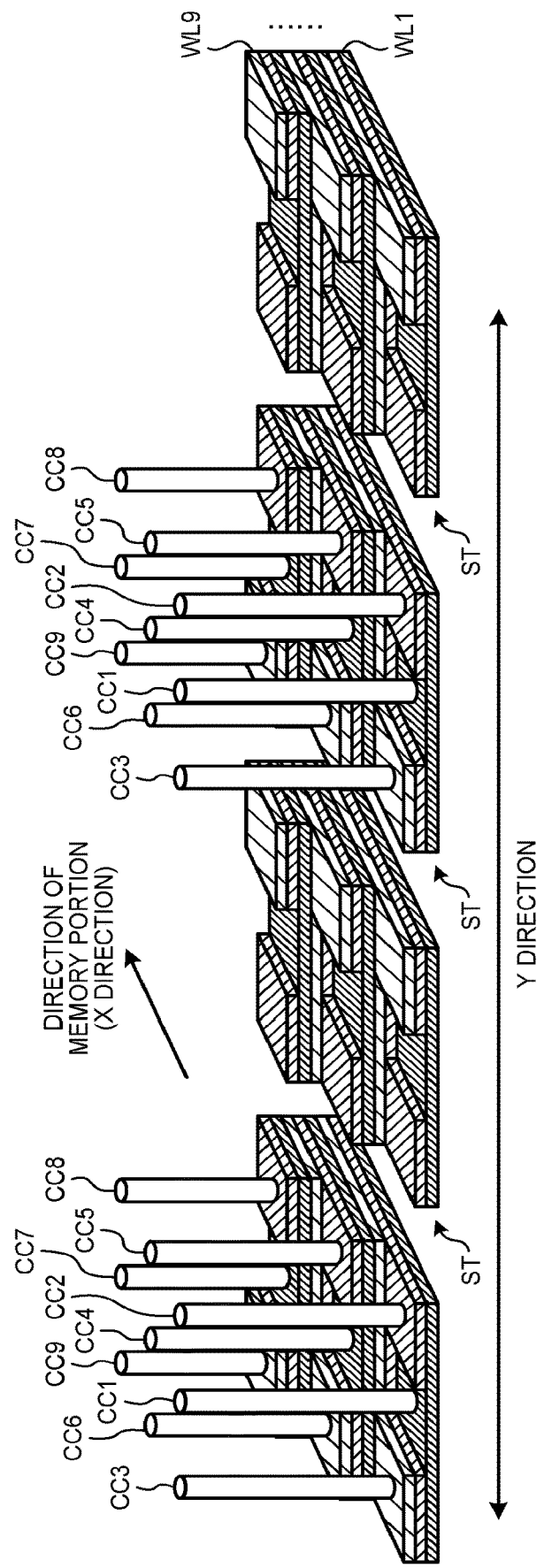

SEMICONDUCTOR STORAGE DEVICE AND METHOD FOR MANUFACTURING SEMICONDUCTOR STORAGE DEVICE

CROSS-REFERENCE TO RELATED APPLICATIONS

This application is based upon and claims the benefit of priority from Japanese Patent Application No. 2019-038626, filed on Mar. 4, 2019; the entire contents of which are incorporated herein by reference.

FIELD

Embodiments described herein relate generally to a semiconductor storage device and a method for manufacturing a semiconductor storage device.

BACKGROUND

In recent years, miniaturization of semiconductor storage devices has progressed, and a three-dimensional non-volatile memory having memory cells in a stacked structure has been proposed. In the three-dimensional non-volatile memory, a stair-like structure is sometimes employed in order to lead out word lines in the respective layers of the memory cells arranged in the height direction. It is desirable to minimize the area occupied by such a stair-like structure.

BRIEF DESCRIPTION OF THE DRAWINGS

FIGS. 15A and 15B are schematic views illustrating invalid areas of the semiconductor storage device according to the comparative example and the semiconductor storage device according to the first embodiment;

FIG. 23A and FIG. 23B are schematic views illustrating a two-row stair structure of the semiconductor storage device according to the third embodiment;

FIGS. 25A and 25B are schematic views illustrating a three-row stair structure of a semiconductor storage device according to a comparative example.

DETAILED DESCRIPTION

A semiconductor storage device of an embodiment includes: a stacked body in which a plurality of conductive layers are alternately stacked in a first direction with an insulating layer interposed therebetween. The stacked body includes: a plurality of pillars arranged to extend in the first direction of the stacked body; a first stair portion which is formed in a stair shape such that a first conductive layer group out of the conductive layers descends in a second direction that is a direction away from the pillar, and has a plurality of steps, one step formed of a terrace surface and a step surface extending in a third direction intersecting the first direction and the second direction; a second stair portion which is formed in a stair shape such that a second conductive layer group out of the conductive layers descends in the second direction, and has a plurality of steps, one step formed of a terrace surface and a step surface extending in the third direction; and a third stair portion which is provided to face the first stair portion, is formed in a stair shape such that a third conductive layer group out of the conductive layers ascends in the second direction, and has a plurality of steps, one step formed of a terrace surface and a step surface extending in the third direction. The second conductive layer group is located below the first conductive layer group in the first direction. The third conductive layer group is located at a position identical to the first conductive layer group in the first direction. The number of conductive layers included in the first conductive layer group of the first stair portion is equal to the number of conductive layers included in the third conductive layer group of the third stair portion. A distance from an upper end of an uppermost step surface of the first stair portion to an upper end of a lowermost step surface of the first stair portion at a position identical to the upper end in the third direction is longer than a distance from an upper end of an uppermost step surface of the third stair portion to an upper end of a lowermost step surface of the third stair portion at a position identical to the upper end in the third direction.

Hereinafter, the present invention will be described in detail with reference to the drawings. Incidentally, the present invention is not limited to the following embodiments. In addition, constituent elements in the following embodiments include those that can be easily assumed by those skilled in the art or those that are substantially the same.

First Embodiment

Hereinafter, a first embodiment will be described with reference to the drawings.

(Configuration Example of Semiconductor Storage Device)

Figure 1A:
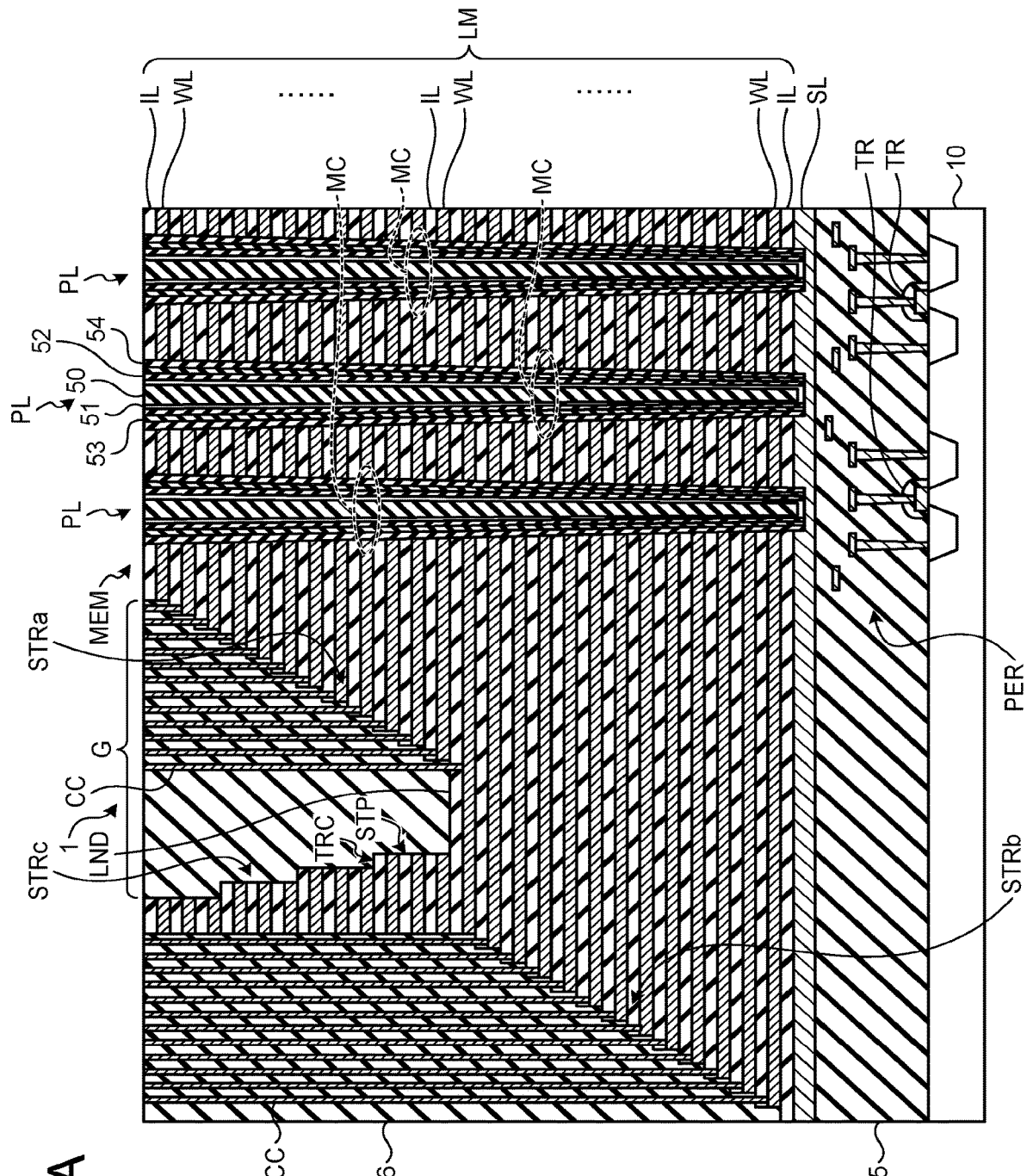
FIGS. 1A and 1B are cross-sectional views schematically illustrating a configuration example of a semiconductor storage device according to a first embodiment.
Figure 1B:
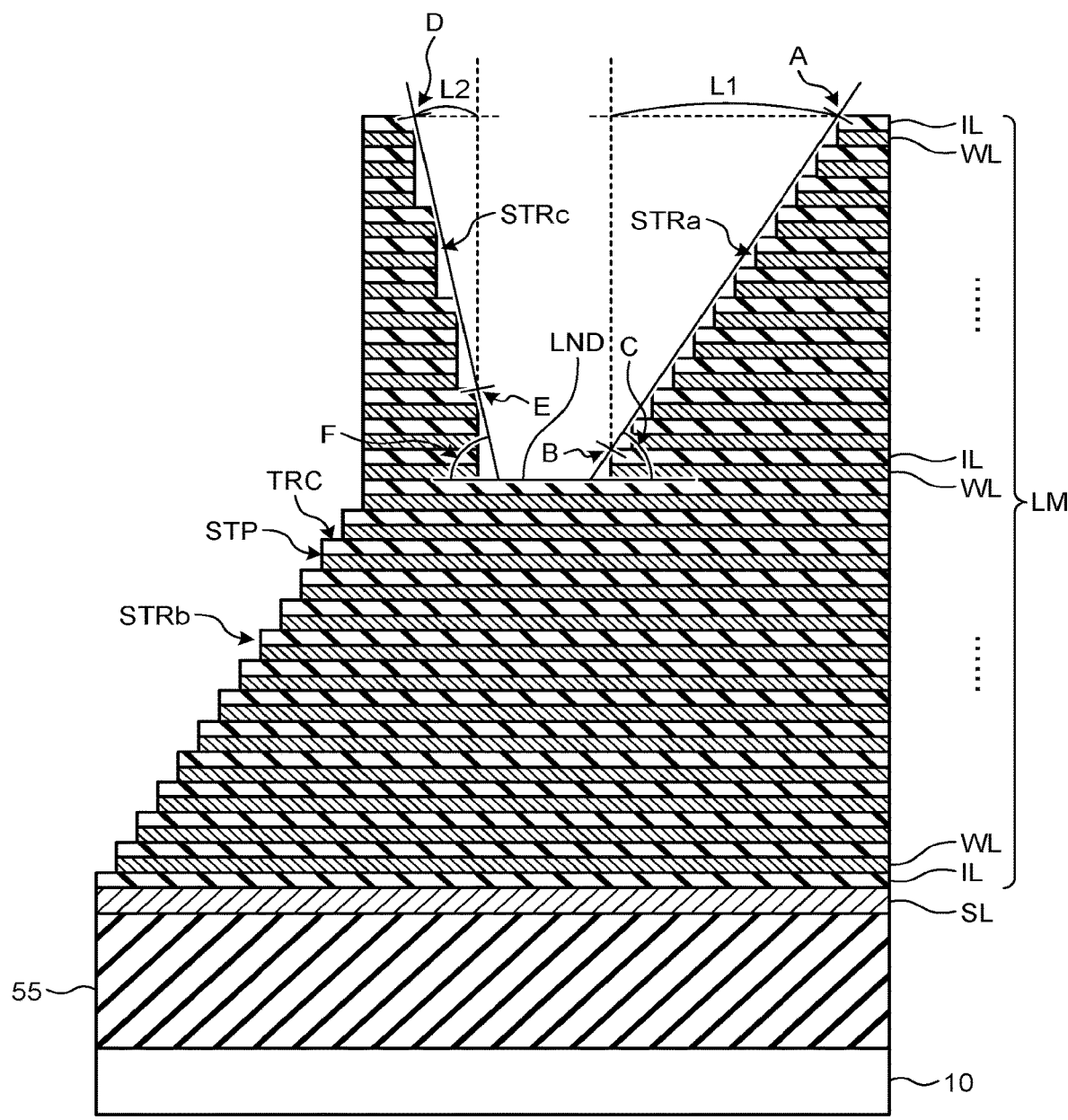

FIGS. 1A and 1B are cross-sectional views schematically illustrating a configuration example of a semiconductor storage device 1 according to the first embodiment. FIG. 1A is a cross-sectional view including a memory portion MEM, stair portions STRa, STRb, and STRc, and a peripheral circuit PER. FIG. 1B is an enlarged cross-sectional view in the vicinity of the stair portions STRa, STRb, and STRc.

Incidentally, the vertical direction in the present specification is defined based on shapes of the stair portions STRa, STRb, and STRc and the like to be described hereinafter. Specifically, a direction that terrace surfaces TRC of the stair portions STRa, STRb, and STRc, that is, exposed surfaces of insulating layers IL in the respective steps of the stair portions STRa, STRb, and STRc face is set to an upward direction.

As illustrated in FIG. 1A, the semiconductor storage device 1 includes the peripheral circuit PER arranged on a substrate 10 such as a silicon substrate, and a stacked body LM arranged on the peripheral circuit PER.

The peripheral circuit PER includes a transistor TR and the like, and contributes to the operation of a memory cell MC arranged in the stacked body LM. The memory cell MC will be described later. The peripheral circuit PER is covered with an insulating layer 55.

A source line SL is arranged on the insulating layer 55. The source line SL is constituted by, for example, a polysilicon layer or the like.

The stacked body LM in which a plurality of word lines WL serving as conductive layers and the insulating layers IL are alternately stacked is arranged on the source line SL. The word line WL is, for example, a tungsten layer or a molybdenum layer. The insulating layer IL is, for example, a $SiO_2$ layer or the like. The number of the stacked word lines WL and insulating layers IL is arbitrary. The stacked body LM includes the memory portion MEM and the stair portions STRa, STRb, and STRc.

In the memory portion MEM, a plurality of pillars PL are arranged in a matrix. The pillar PL has a columnar structure which penetrates through the stacked body LM to reach the source line SL. In addition, the pillar PL is constituted by a plurality of layers. Specifically, the pillar PL includes a core layer 50, a channel layer 51, a tunnel insulating layer 52, a charge storage layer 53, and a block insulating layer 54 in order from the inner side of the pillar PL. The core layer 50, the tunnel insulating layer 52, and the block insulating layer 54 are, for example, $SiO_2$ layers or the like. The channel layer 51 is, for example, an amorphous silicon layer or a polysilicon layer. The charge storage layer 53 is, for example, a SiN layer or the like.

With the above configuration, the plurality of memory cells MC are formed at intersections between the pillars PL and the plurality of word lines WL. A predetermined voltage is applied to the memory cell MC from the word line WL, and the predetermined voltage is held in the charge storage layer 53 so that data is held in a non-volatile manner. In addition, data can be read from the memory cell MC by applying a predetermined voltage from the word line WL. The semiconductor storage device 1 is configured, for example, as a three-dimensional non-volatile memory in which the memory cells MC are three-dimensionally arranged in the stacked body LM.

Incidentally, one or more word lines WL including the word line WL in the lowermost layer of the stacked body LM and one or more word lines WL including the word line WL on the uppermost layer of the stacked body LM may function as select gate lines to select a predetermined pillar PL. In this case, a select gate is formed at an intersection between the select gate line and the pillar PL. A predetermined voltage is applied from the select gate line to turn on or off the select gate, whereby the predetermined pillar PL including the memory cell MC to be operated is selected.

The stair portions STRa, STRb, and STRc in which the word line WL and the insulating layer IL are formed in a stair shape are arranged at an end of the stacked body LM. In the stacked body LM, a groove G is provided between the stair portion STRa and the stair portion STRc. The stair portion STRa, which is a first stair portion, is arranged closest to the memory portion MEM, and is configured to ascend in steps toward the memory portion MEM. The stair portion STRb, which is a second stair portion, is arranged at a position farthest from the memory portion MEM, and is configured to ascend in steps toward the memory portion MEM. The stair portion STRc, which is a third stair portion, is arranged between the stair portions STRa and STRb, and is configured to descend in steps toward the memory portion MEM. A landing portion LND is arranged between the stair portions STRa and STRc to serve as a connection portion that connects the lowermost steps thereof. The stair portions STRa, STRb, and STRc are covered with, for example, an insulating layer 56 having the same height as a height position of an upper surface of the stacked body LM.

The stair portion STRa is constituted by the word line WL and the insulating layer IL in an upper layer part of the stacked body LM. The stair portion STRb is constituted by the word line WL and the insulating layer IL in a lower layer part of the stacked body LM. In the stair portions STRa and STRb, for example, one step is constituted by one layer of the word line WL and one layer of the insulating layer IL which is the upper layer of the one layer of the word line WL. Here, in the stair portions STRa and STRb and the stair portion STRc to be described later, each step has the terrace surface TRC and a step surface STP. In FIG. 1A, these reference signs TRC and STP are attached only to one step of the stair portion STRc. In the terrace surface TRC of each of the stair portions STRa and STRb, for example, an upper surface of one layer of the insulating layer IL of the upper layer is exposed, and side surfaces of one layer of the word line WL and one layer of the insulating layer IL are exposed in the step surface STP.

The word lines WL constituting the stair portions STRa and STRb are connected to the memory cells MC arranged at the same height positions, respectively. In other words, all the word lines WL included in the stacked body LM constitute one of the steps of the stair portions STRas and STRbs, except for the word lines WL constituting the landing portion LND. As a result, the stair portions STRa and STRb function as lead-out portions of the word lines WL. Then, a contact CC, which penetrates through the insulating layer 56 covering the stair portions STRa and STRb and the insulating layer IL in the upper layer of the word line WL constituting each step and connects the word line WL and an upper layer wiring (not illustrated), is arranged in each step of the stair portions STRa and STRb. In addition, the contact CC is arranged even in the above-described landing portion LND. A surface of the landing portion LND excluding an area to which the contact CC is connected is covered with the insulating layer IL.

The stair portion STRc is configured to include at least some of the word lines WL and the insulating layers IL located at the same stacking positions as the word lines WL and the insulating layers IL in the upper layer part constituting the stair portion STRa. As described above, ascending/descending directions of steps of the stair portions STRa and STRc are opposite, and the stair portions STRa and STRc face each other. In the stair portion STRc, one step is ideally constituted by, for example, three layers of the word lines WL and the three layers of insulating layers IL which are upper layers of the respective word lines WL. In the terrace surface TRC of the stair portion STRc, for example, an upper surface of the uppermost layer among the three insulating layers IL is exposed, and side surfaces of the three layers of the word lines WL and the three layers of the insulating layers IL are exposed in the step surface STP. Widths of the terrace surfaces TRC, which are flat parts of the respective steps of the stair portions STRa, STRb, and STRc, are substantially equal, for example, and thus, the stair portion STRc generally has a steeper gradient than the stair portions STRa and STRb.

However, such configurations relating to the stair portion STRc are examples in a case where a manufacturing process to be described later is ideally performed, and are not necessarily applied to the actual stair portion STRc in some cases. For example, in the process of manufacturing the stair portion STRc, there is a case where alignment of the steps is performed with lower accuracy than the stair portions STRa and STRb, and the respective steps of the stair portion STRc are not always configured regularly, and a gradient thereof changes in somewhere of the halfway of the stair portion STRc in some cases. What can at least be said regarding the stair portion STRc is that a stair length of the stair portion STRc is shorter than a stair length of the stair portions STRa and STRb.

The word line WL constituting the stair portion STRc is not connected to the memory cell MC, and the stair portion STRc is a dummy stair having no function as a lead-out portion of the word line WL. The stair portion STRc is an invalid area which does not contribute to the function of the semiconductor storage device 1.

Here, the definitions of the gradients, the stair lengths, and the like of the stair portions STRa, STRb, and STRc described above will be described in more detail with reference to FIG. 1B.

The gradient of the stair portion STRa is defined as follows. A virtual straight line A-B is drawn between an upper end A of the uppermost step and an upper end B of the lowermost step of the stair portion STRa, and an angle C between an upper surface of the landing portion LND, below the stair portion STRa with which a lower end of the lowermost step of the stair portion STRa is in contact and an extension of the virtual straight line A-B is defined as the gradient of the stair portion STRa. Here, the upper end A of the uppermost step and the upper end B of the lowermost step of the stair portion STRa are set to be located at the same position in the depth direction of the stair portion STRa, that is, in a direction toward the depth direction of the paper surface of FIG. 1B.

As described above, the gradient of the stair portion STRa may change in somewhere of the halfway of the stair portion STRa from the view of the manufacturing process. However, at least an average gradient of the stair portion STRa can be discussed by defining the gradient of the stair portion STRa as described above.

The stair length of the stair portion STRa is defined as follows. A horizontal distance L1 between the upper end A of the uppermost step and the upper end B of the lowermost step of the stair portion STRa in a direction from an arrangement position of the stair portion STRa to an arrangement position of the memory portion MEM is defined as the stair length of the stair portion STRa.

The gradient of the stair portion STRc is defined as follows similarly to the above description. An angle F between an extension of a virtual straight line D-E between an upper end D of the uppermost step and an upper end E of the lowermost step of the stair portion STRc and an upper surface of the landing portion LND below the stair portion STRc with which a lower end of the lowermost step of the stair portion STRc is in contact is defined as the gradient of the stair portion STRc. Here, the upper end D of the uppermost step and the upper end E of the lowermost step of the stair portion STRc are set to be located at the same position in the depth direction of the stair portion STRc, that is, in a direction toward the depth direction of the paper surface of FIG. 1B.

In addition, the stair length of the stair portion STRc is defined as follows similarly to the above description. A horizontal distance L2 between the upper end D of the uppermost step and the upper end E of the lowermost step of the stair portion STRc in a direction from an arrangement position of the stair portion STRc to the arrangement position of the memory portion MEM is defined as the stair length of the stair portion STRc.

According to the above definition, the following can be said regarding the stair portions STRa and STRc. The gradient of the stair portion STRa is smaller than the gradient of the stair portion STRc. The stair length of the stair portion STRa is longer than the stair length of the stair portion STRc. More simply, the distance between the upper end A of the uppermost step and the upper end B of the lowermost step of the stair portion STRa is longer than the distance between the upper end D of the uppermost step and the upper end E of the lowermost step of the stair portion STRc. The above relationship between the distance of the virtual straight line A-B of the stair portion STRa and the distance of the virtual straight line D-E of the stair portion STRc is maintained, for example, even when the gradients of the stair portions STRa and STRc change in somewhere of the halfway of either of the stair portions STRa and STRc from the view of the manufacturing process.

In addition, the following can be said, in principle, regarding the stair portions STRa and STRb in light of the process of manufacturing the semiconductor storage device 1 to be described later. The gradient of the stair portion STRb is substantially equal to the gradient of the stair portion STRa. The stair length of the stair portion STRb is substantially equal to the stair length of the stair portion STRa. More simply, the distance between an upper end of the uppermost step and an upper end of the lowermost step of the stair portion STRb is substantially equal to the distance between the upper end A of the uppermost step and the upper end B of the lowermost step of the stair portion STRa.

(Example of Process of Manufacturing Semiconductor Storage Device)

Next, an example of the process of manufacturing the semiconductor storage device 1 according to the first embodiment will be described with reference to FIGS. 2A to 13. FIGS. 2A to 13 are flow diagrams illustrating examples of a procedure of the process of manufacturing the semiconductor storage device 1 according to the first embodiment. Some configurations such as a lower layer structure of the stacked body LM and the memory portion MEM are sometimes omitted in FIGS. 2A to 13.

First, the peripheral circuit PER including the transistor TR and the like is formed on the substrate 10 such as a silicon substrate. The peripheral circuit PER can be formed using a general semiconductor circuit formation method. The insulating layer 55 covering the peripheral circuit PER is formed, and the source line SL such as a polysilicon layer is formed on the insulating layer 55.

Figure 2A:
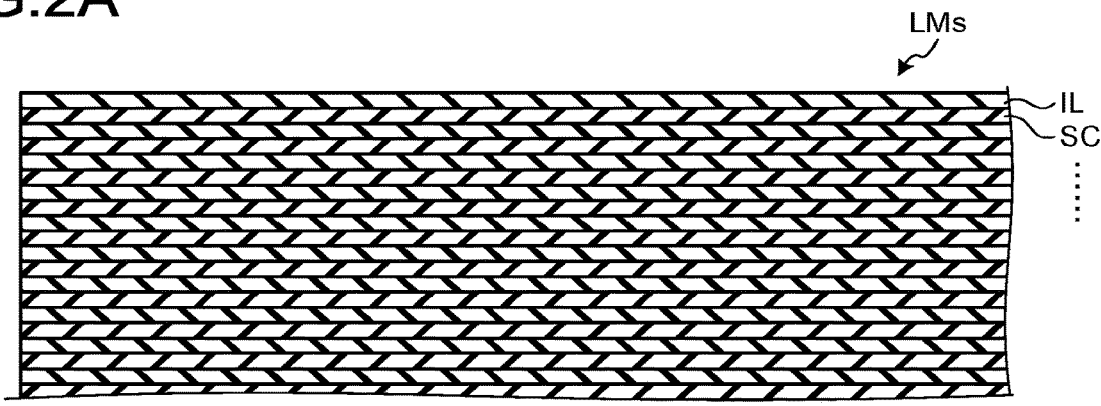
FIGS. 2A to 2C are flow diagrams illustrating examples of a procedure of a process of manufacturing the semiconductor storage device according to the first embodiment.

As illustrated in FIG. 2A, a stacked body LMs in which a plurality of sacrificial layers SC, which are first layers, and the insulating layers IL, which are second layers, are alternately stacked is formed above the substrate 10. However, only an upper layer part of the stacked body LMs is illustrated in FIG. 2A and the subsequent drawings.

The sacrificial layer SC is, for example, an insulating layer such as a SiN layer different from the insulating layer IL, and is a layer to be replaced with a conductive material such as tungsten and molybdenum in a subsequent process.

Thereafter, a stair-like structure is formed in the stacked body LMs.

Figure 2B:
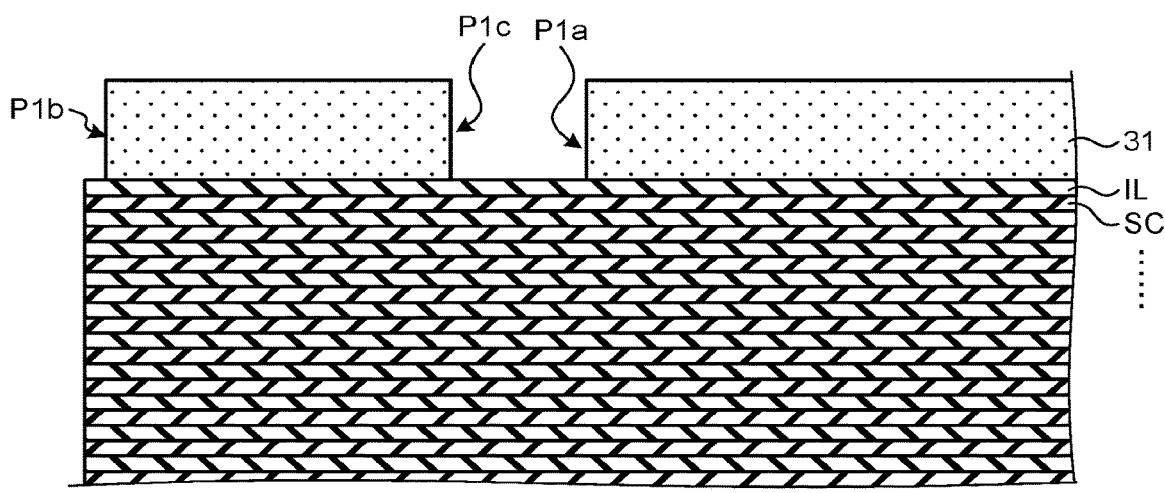

As illustrated in FIG. 2B, a resist pattern 31 is formed on the stacked body LMs to cover the entire area, which is to serve as the memory portion MEM, and partial areas which are to serve as the stair portions STRa, STRb, and STRc.

In FIG. 2B, the resist pattern 31 extends in the depth direction of the paper surface, for example, by the width of the memory portion MEM. In addition, a distance of an end P1a of the resist pattern 31 from the memory portion MEM is substantially equal to a distance of the step surface STP, which is the lowermost stepped part of the stair portion STRa to be formed later, from the memory portion MEM. In addition, a distance of an end P1b of the resist pattern 31 from the memory portion MEM is substantially equal to a distance from the memory portion MEM of the lowermost step surface STP of the stair portion STRb to be formed later. In addition, a distance of an end P1c of the resist pattern 31 from the memory portion MEM is substantially equal to a distance from the memory portion MEM of the lowermost step surface STP of the stair portion STRc to be formed later.

Figure 2C:
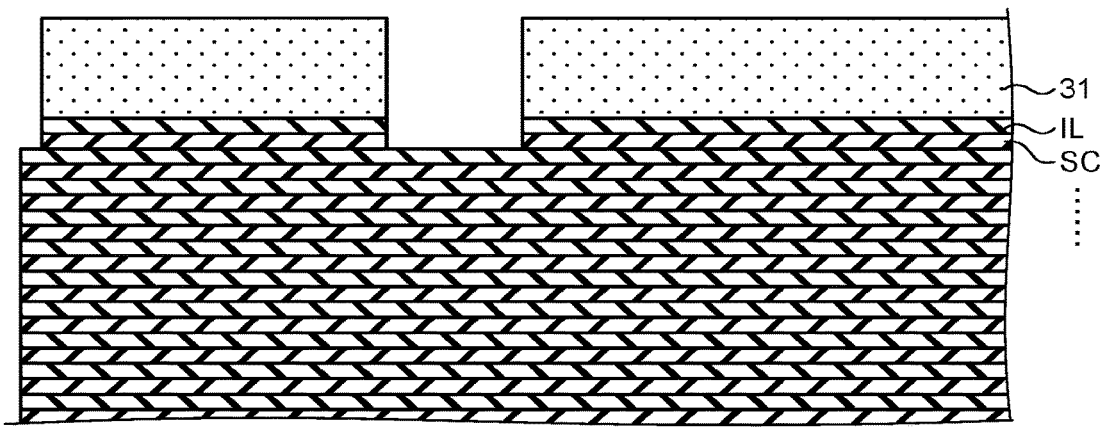

As illustrated in FIG. 2C, the uppermost insulating layer IL and sacrificial layer SC of the stacked body LMs are removed using the resist pattern 31 as a mask.

Figure 3A:
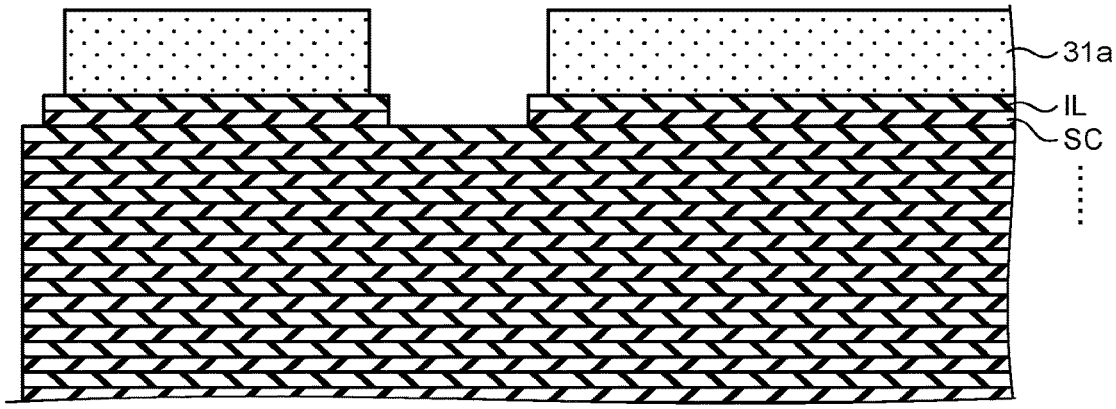
FIGS. 3A to 3C are flow diagrams illustrating examples of the procedure of the process of manufacturing the semiconductor storage device according to the first embodiment.

As illustrated in FIG. 3A, the resist pattern 31 is slimmed by $O_2$ plasma or the like to form a resist pattern 31a. At this time, the slimming amount is adjusted such that the resist pattern 31a is retracted by about widths of the terrace surfaces TRC of the stair portions STRa, STRb, and STRc to be formed later. As a result, the uppermost insulating layer IL and sacrificial layer SC of the stacked body LMs are newly exposed at the bottom edge of the resist pattern 31a.

Figure 3B:
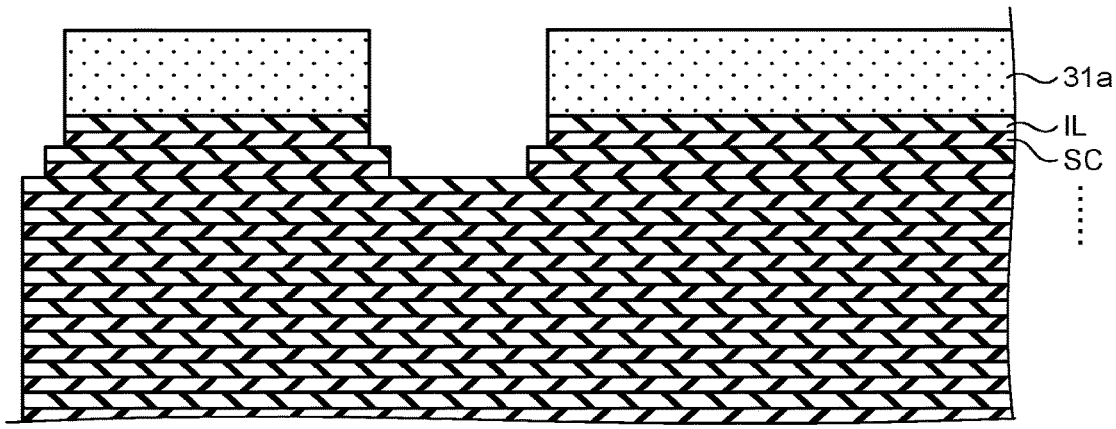

As illustrated in FIG. 3B, the newly exposed uppermost insulating layer IL and sacrificial layer SC are removed using the resist pattern 31a as a mask. At this time, in a part where the uppermost insulating layer IL and sacrificial layer SC have already been removed, the insulating layer IL and the sacrificial layer SC on a lower layer of the removed insulating layer IL and sacrificial layer SC are removed.

Figure 3C:
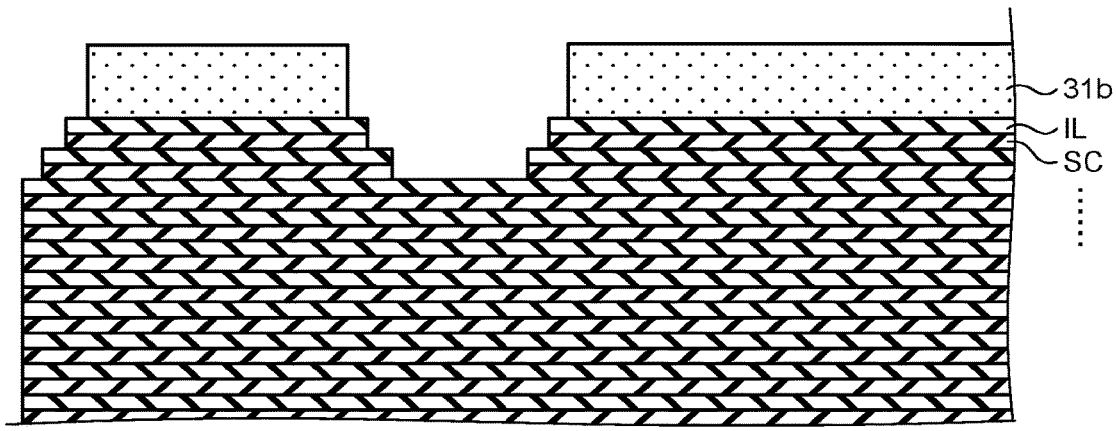

As illustrated in FIG. 3C, the resist pattern 31a is slimmed by $O_2$ plasma or the like to form a resist pattern 31b. The uppermost insulating layer IL and sacrificial layer SC of the stacked body LMs are newly exposed at the bottom edge of the resist pattern 31b.

Figure 4A:
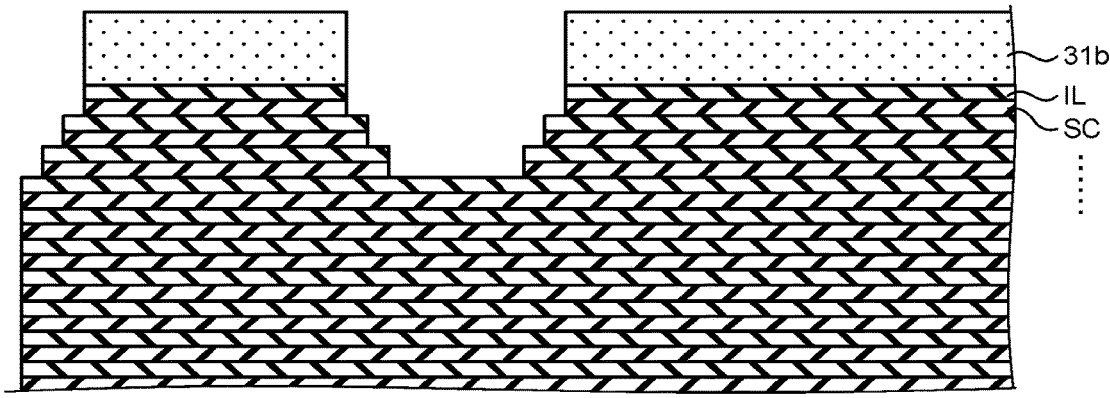
FIGS. 4A to 4C are flow diagrams illustrating examples of the procedure of the process of manufacturing the semiconductor storage device according to the first embodiment.

As illustrated in FIG. 4A, the newly exposed uppermost insulating layer IL and sacrificial layer SC are removed using the resist pattern 31b as a mask. At this time, in a part where the uppermost insulating layer IL and sacrificial layer SC have already been removed, the insulating layer IL and the sacrificial layer SC on a lower layer of the removed insulating layer IL and sacrificial layer SC are removed. In addition, in a part where the insulating layer IL and the sacrificial layer SC on the lower layer of the uppermost layer have already been removed, the insulating layer IL and the sacrificial layer SC on a lower layer below the removed insulating layer IL and sacrificial layer SC are removed.

Figure 4B:
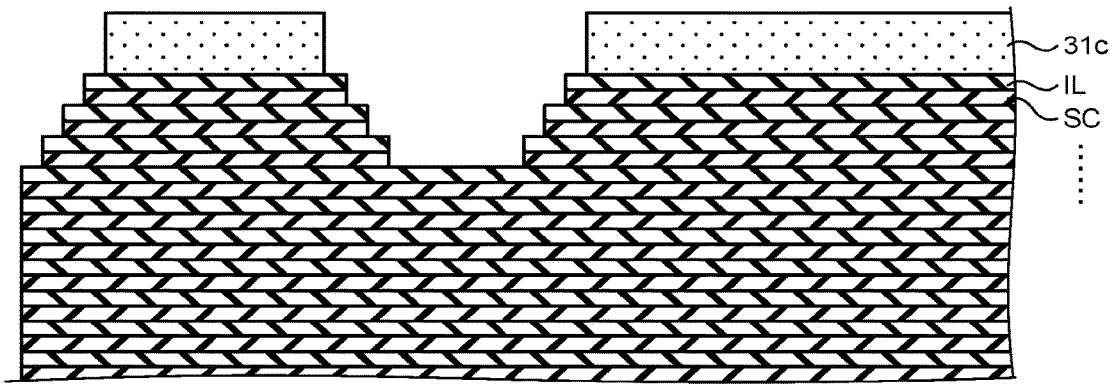

As illustrated in FIG. 4B, the resist pattern 31b is slimmed by $O_2$ plasma or the like to form a resist pattern 31c. The uppermost insulating layer IL and sacrificial layer SC of the stacked body LMs are newly exposed at the bottom edge of the resist pattern 31c.

Figure 4C:
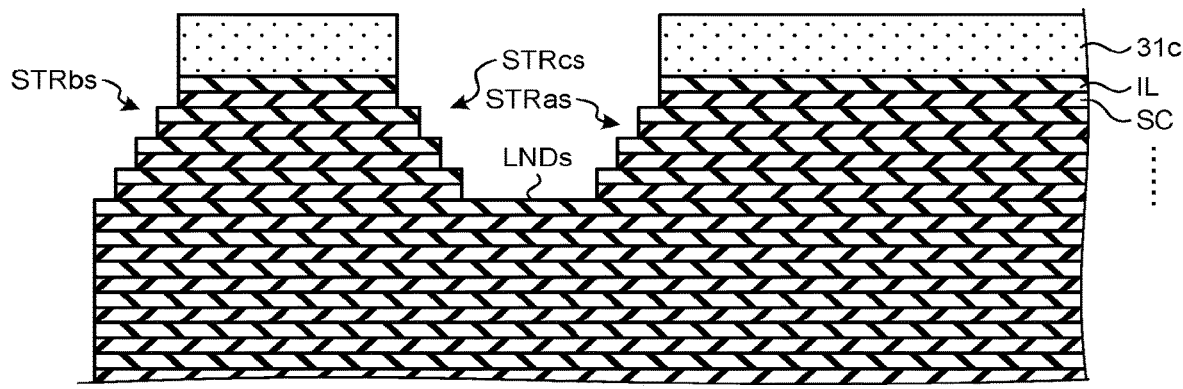

As illustrated in FIG. 4C, the newly exposed uppermost insulating layer IL and sacrificial layer SC are removed using the resist pattern 31c as a mask. At this time, in a part where the uppermost insulating layer IL and sacrificial layer SC have already been removed, the insulating layer IL and the sacrificial layer SC on a lower layer of the removed insulating layer IL and sacrificial layer SC are removed. In addition, in a part where the insulating layer IL and the sacrificial layer SC on the lower layer of the uppermost layer have already been removed, the insulating layer IL and the sacrificial layer SC on a lower layer below the removed insulating layer IL and sacrificial layer SC are removed. In addition, in a part where the insulating layer IL and the sacrificial layer SC on the lower layer below the lower layer of the uppermost layer have already been removed, the insulating layer IL and the sacrificial layer SC on a lower layer below the removed insulating layer IL and sacrificial layer SC are removed.

With the processing described so far, a stair portion STRas corresponding to four steps is formed at the closest position from a planned formation position of the memory portion MEM so as to ascend in steps to the memory portion MEM. In addition, a stair portion STRbs corresponding to four steps is formed at the farthest position from a planned formation position of the memory portion MEM so as to ascend in steps to the memory portion MEM. In addition, a stair portion STRcs corresponding to four steps is formed between the stair portions STRas and STRbs so as to descend in steps to the memory portion MEM. In addition, a landing portion LNDs connecting the lowermost steps of the stair portions STRas and STRcs is formed between these stair portions STRas and STRcs. The stair portions STRas, STRbs, and STRcs are constituted by layers having the same stacking positions in the stacked body LMs, and are formed, for example, at the same height position.

In this manner, a pair of the insulating layer IL and the sacrificial layer SC located at a predetermined stacking position counted from the uppermost layer is collectively subjected to the same processing in a process of forming the stair-like structure in the stacked body LMs. Thereafter, a pair of the uppermost insulating layer IL and sacrificial layer SC will be sometimes referred to as the insulating layer IL and the sacrificial layer SC of the first set, and a pair of the insulating layer IL and the sacrificial layer SC on a lower layer of the uppermost insulating layer IL and sacrificial layer SC will be sometimes referred to as the insulating layer IL and the sacrificial layer SC of the second set.

After the processing of FIG. 4C, the resist pattern 31c is removed.

Figure 5A:
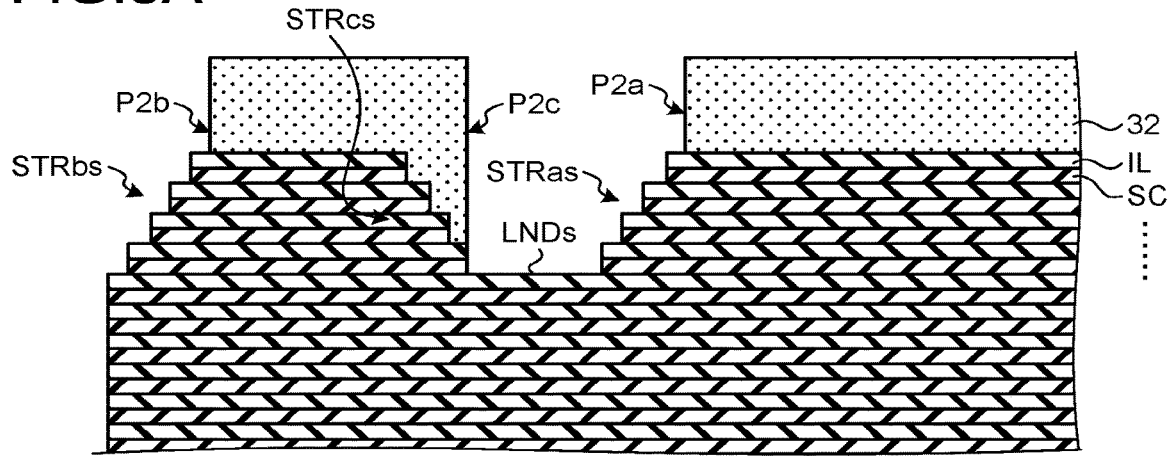
FIGS. 5A to 5C are flow diagrams illustrating examples of the procedure of the process of manufacturing the semiconductor storage device according to the first embodiment.

As illustrated in FIG. 5A, a resist pattern 32 is formed on the stacked body LMs to cover the entire area, which is to serve as the memory portion MEM, and partial areas of the stair portions STRas, STRbs, and STRcs.

In FIG. 5A, the resist pattern 32 extends in the depth direction of the paper surface, for example, by the width of the memory portion MEM. In addition, an end P2a of the resist pattern 32 is retracted by about the width of the terrace surface TRC from the uppermost step surface STP of the stair portion STRas formed last in FIG. 4C. In addition, an end P2b of the resist pattern 32 is retracted by about the width of the terrace surface TRC from the uppermost step surface STP of the stair portion STRbs formed last in FIG. 4C. In addition, a position of the end P2c of the resist pattern 32 coincides with a position of the lowermost step surface STP of the stair portion STRcs formed last in FIG. 4C. That is, the resist pattern 32 covers the entire stair portion STRcs up to the lowermost terrace surface TRC.

Figure 5B:
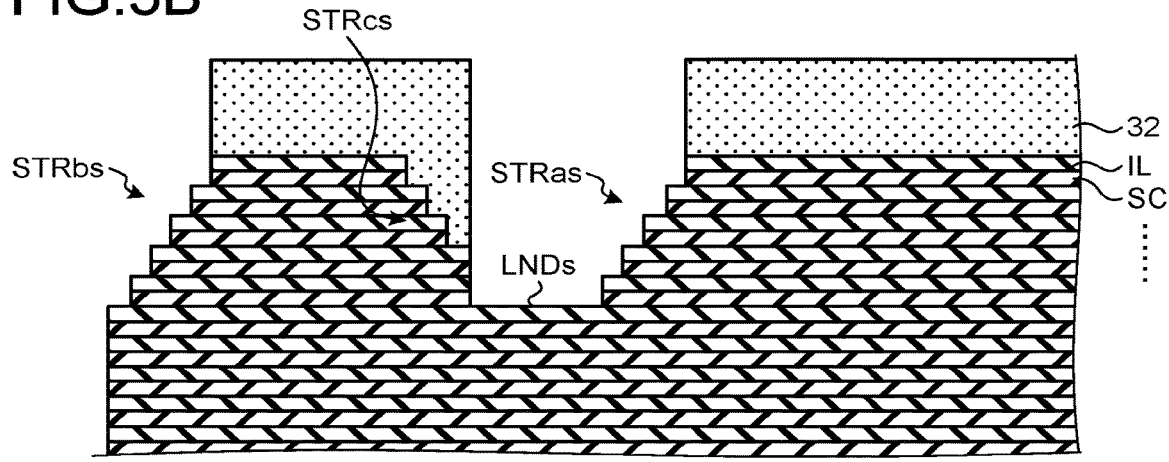

As illustrated in FIG. 5B, a set of insulating layer IL and the sacrificial layer SC is removed in exposed portions of the stacked body LMs using the resist pattern 32 as a mask. As a result, in the stair portions STRas and STRbs, a set of the insulating layer IL and the sacrificial layer SC is removed from each step one by one to be a step below the step, the uppermost step is newly formed at the bottom edge of the resist pattern 32, and the fifth set of the insulating layer IL and the sacrificial layer SC from the uppermost layer newly becomes the lowermost step.

Since the stair portion STRc is covered with the resist pattern 32, each step of the stair portion STRc is not removed. However, one set of insulating layer IL and sacrificial layer SC at the bottom edge of the resist pattern 32 covering the lowermost step of stair portion STRc is removed so that the lowermost step of the stair portion STRc is constituted by two sets of the insulating layers IL and the sacrificial layers SC, and a difference in level of the lowermost step increases.

Figure 5C:
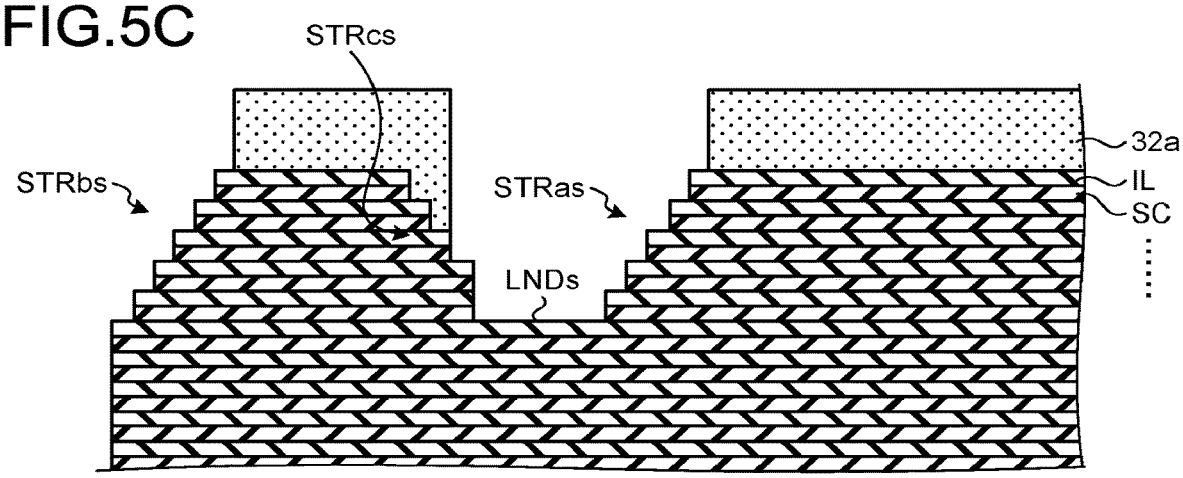

As illustrated in FIG. 5C, the resist pattern 32 is slimmed by $O_2$ plasma or the like to form a resist pattern 32a. At this time, the slimming amount is adjusted such that the resist pattern 32a is retracted by about widths of the terrace surfaces TRC of the stair portions STRas, STRbs, and STRcs. As a result, the uppermost insulating layer IL and sacrificial layer SC of the stacked body LMs are newly exposed at the bottom edge of the resist pattern 32a in the stair portions STRas and STRbs. In addition, the lowermost step of the stair portion STRcs is exposed at the bottom edge of the resist pattern 32 in the stair portion STRcs.

Figure 6A:
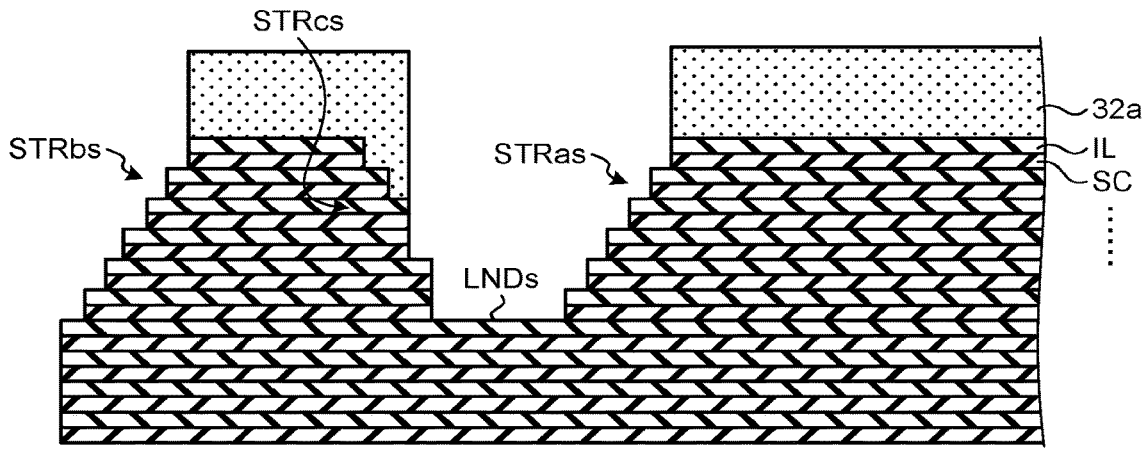
FIGS. 6A to 6C are flow diagrams illustrating examples of the procedure of the process of manufacturing the semiconductor storage device according to the first embodiment.

As illustrated in FIG. 6A, a set of insulating layer IL and the sacrificial layer SC is removed in exposed portions of the stacked body LMs using the resist pattern 32a as a mask. As a result, in the stair portions STRas and STRbs, a set of the insulating layer IL and the sacrificial layer SC is removed from each step one by one to be a step below the step, the uppermost step is newly formed at the bottom edge of the resist pattern 32a, and the sixth set of the insulating layer IL and the sacrificial layer SC from the uppermost layer newly becomes the lowermost step.

In addition, one set of the upper insulating layer IL and sacrificial layer SC is removed between two sets of the insulating layers IL and the sacrificial layers SC constituting the exposed lowermost step, in the stair portion STRc. As a result, the second lowermost step of the stair portion STRc is newly constituted by two sets of the insulating layers IL and the sacrificial layers SC, and a difference in level increases. In addition, the fifth and sixth sets of the insulating layers IL and the sacrificial layers SC from the uppermost layer newly become the lowest step.

Figure 6B:
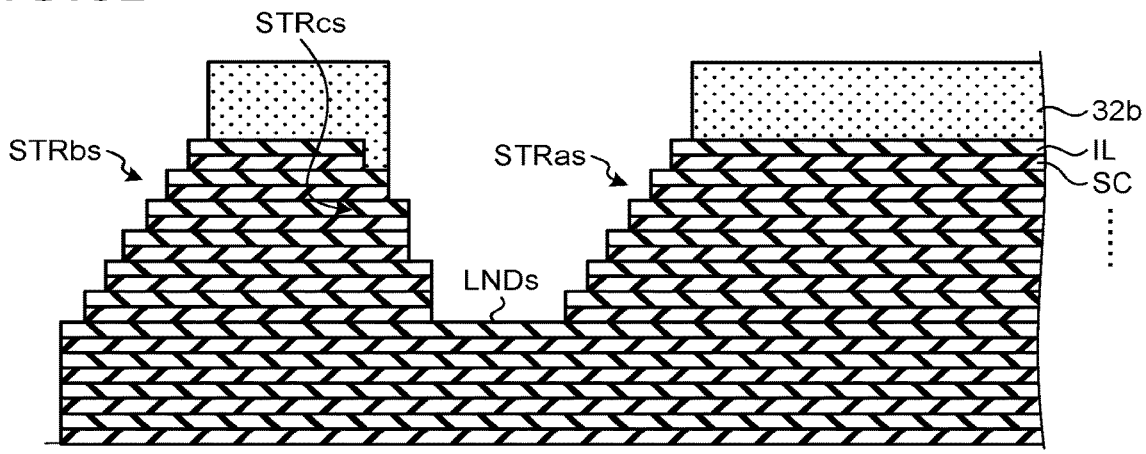

As illustrated in FIG. 6B, the resist pattern 32a is slimmed by $O_2$ plasma or the like to form a resist pattern 32b. As a result, the uppermost insulating layer IL and sacrificial layer SC of the stacked body LMs are newly exposed at the bottom edge of the resist pattern 32b in the stair portions STRas and STRbs. In addition, the second lowermost step of the stair portion STRcs is exposed at the bottom edge of the resist pattern 32b in the stair portion STRcs.

Figure 6C:
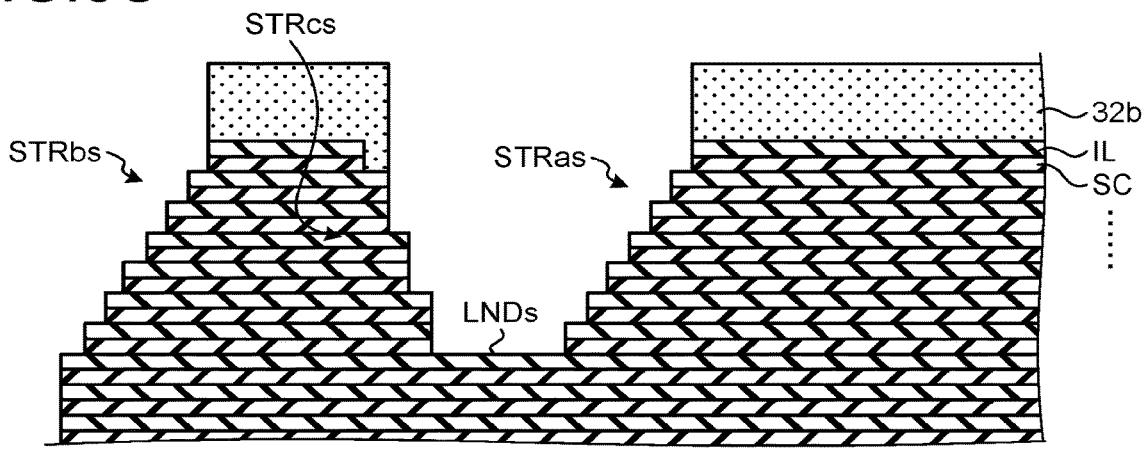

As illustrated in FIG. 6C, a set of insulating layer IL and the sacrificial layer SC is removed in exposed portions of the stacked body LMs using the resist pattern 32b as a mask. As a result, in the stair portions STRas and STRbs, a set of the insulating layer IL and the sacrificial layer SC is removed from each step one by one to be a step below the step, the uppermost step is newly formed at the bottom edge of the resist pattern 32b, and the seventh set of the insulating layer IL and the sacrificial layer SC from the uppermost layer newly becomes the lowermost step.

In addition, one set of the upper insulating layer IL and sacrificial layer SC is removed between two sets of the insulating layers IL and the sacrificial layers SC constituting the exposed second lowermost step, in the stair portion STRc. As a result, the third lowermost step of the stair portion STRc is newly constituted by two sets of the insulating layers IL and the sacrificial layers SC, and a difference in level increases. In addition, the fourth and fifth sets of the insulating layers IL and the sacrificial layers SC from the uppermost layer newly become the second lowermost step, and the sixth and seventh sets of the insulating layers IL and the sacrificial layers SC from the uppermost layer newly become the lowest step.

Figure 7A:
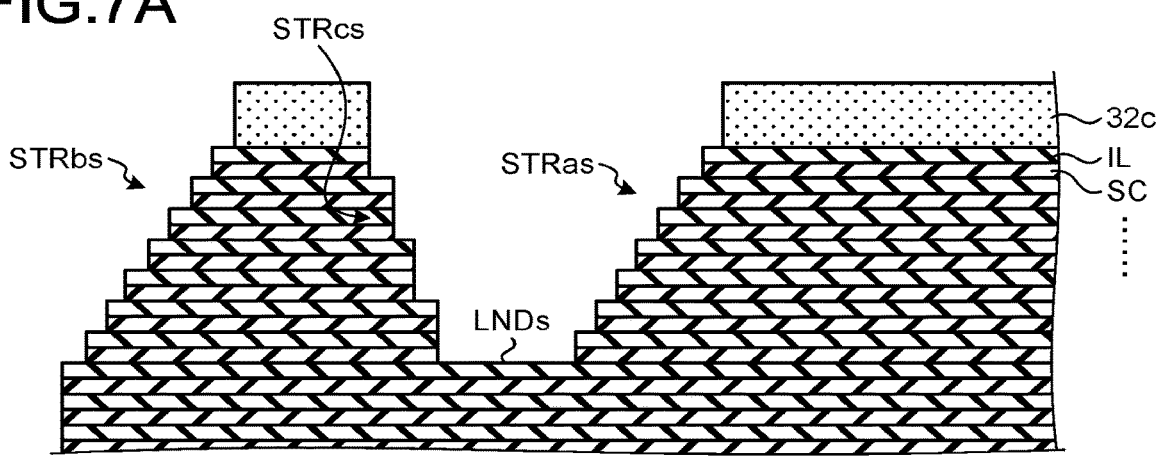
FIGS. 7A to 7C are flow diagrams illustrating examples of the procedure of the process of manufacturing the semiconductor storage device according to the first embodiment.

As illustrated in FIG. 7A, the resist pattern 32b is slimmed by $O_2$ plasma or the like to form a resist pattern 32c.

Figure 7B:
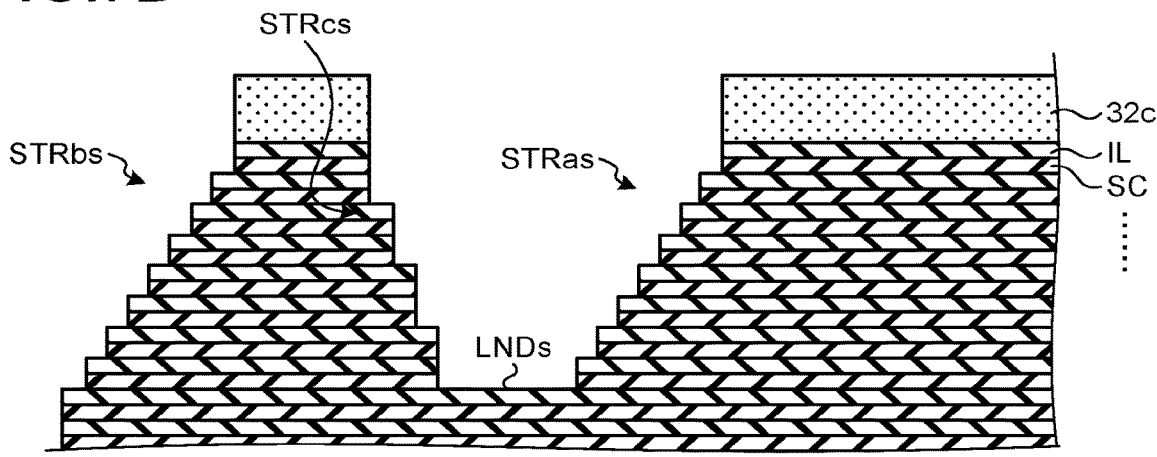

As illustrated in FIG. 7B, a set of insulating layer IL and the sacrificial layer SC is removed in exposed portions of the stacked body LMs using the resist pattern 32c as a mask.

With the processing described so far, each of the stair portions STRas and STRbs forms the stair portion corresponding to eight steps which ascend in steps toward the memory portion MEM. In addition, the stair portion STRcs has each step constituted by two sets of the insulating layers IL and the sacrificial layers SC, and becomes a stair portion corresponding to four steps descending toward the memory portion MEM. In addition, the stair portion STRcs has a steeper gradient than the stair portions STRas and STRbs since each step is constituted by two sets of the insulating layers IL and the sacrificial layers SC with the width of the terrace surface TRC unchanged from that of the stair portions STRas and STRbs.

In this manner, the stair portions STRas, STRbs, and STRcs having equal steps and equal gradients are initially formed by the slimming of the resist pattern 31, and then, the stair portions STRas and STRbs and the stair portion STRcs mutually having different steps and different gradients are formed by the slimming of the resist pattern 32.

In other words, the slimming of the resist pattern 32 causes the stair shape to be extended to the lower layer part of the stacked body LMs in the stair portions STRas and STRbs while retracting the position of the newly formed uppermost step toward the memory portion MEM relative to the newly formed lowermost step. At this time, the positions (distances) of the lowermost steps of the stair portions STRas and STRbs relative to the memory portion MEM remain unchanged.

On the other hand, in the stair portion STRcs, the stair shape is extended to the lower layer part of the stacked body LMs without retracting the position of the uppermost step relative to the newly formed lowermost step. That is, in the stair portion STRcs, only the depth of the stair portion STRcs is increased with the position relative to the lowermost memory portion MEM and the position relative to the uppermost memory portion MEM unchanged. As a result, the stair portion STRcs has the steeper gradient than the stair portions STRas and STRbs.

After the processing of FIG. 7B, the resist pattern 32c is removed.

Figure 7C:
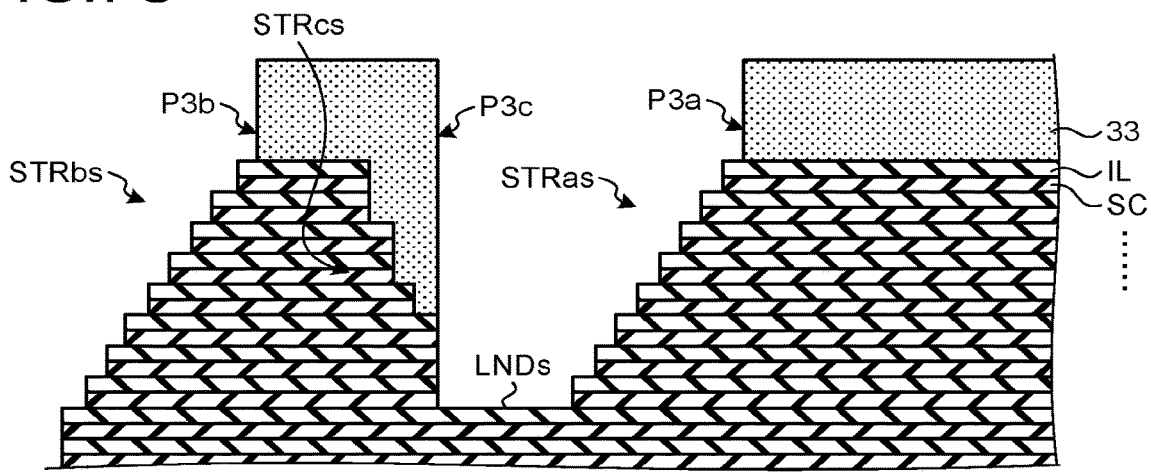

As illustrated in FIG. 7C, a resist pattern 33 is formed on the stacked body LMs to cover the entire area, which is to serve as the memory portion MEM, and partial areas of the stair portions STRas, STRbs, and STRcs.

In FIG. 7C, the resist pattern 33 extends in the depth direction of the paper surface, for example, by the width of the memory portion MEM. In addition, an end P3a of the resist pattern 33 is retracted by about the width of the terrace surface TRC from the uppermost step surface STP of the stair portion STRas formed last in FIG. 7B. In addition, an end P3b of the resist pattern 33 is retracted by about the width of the terrace surface TRC from the uppermost step surface STP of the stair portion STRbs formed last in FIG. 7B. In addition, a position of the end P3c of the resist pattern 33 coincides with a position of the lowermost step surface STP of the stair portion STRcs formed last in FIG. 7B. That is, the resist pattern 33 covers the entire stair portion STRcs up to the lowermost terrace surface TRC.

A set of insulating layer IL and the sacrificial layer SC is removed in exposed portions of the stacked body LMs using the resist pattern 33 as a mask. In addition, the slimming of the resist pattern 33 and the removal of one set of the insulating layer IL and the sacrificial layer SC are repeated three times similarly to the case of the resist pattern 32.

Figure 8A:
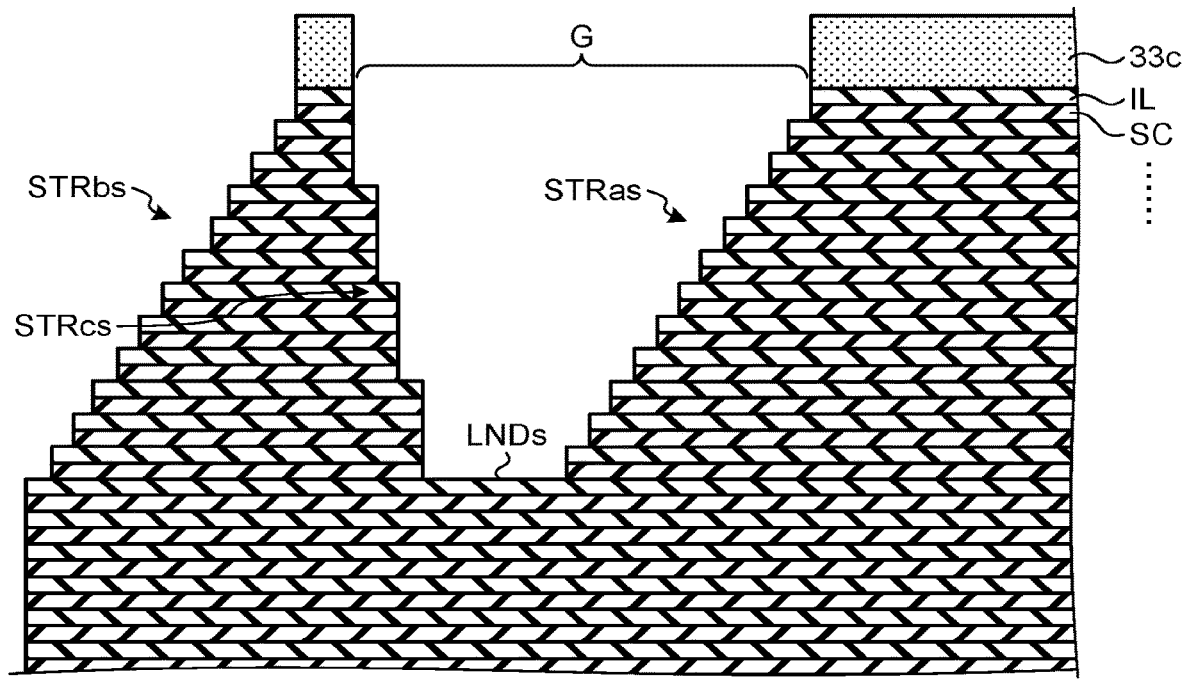
FIGS. 8A and 8B are flow diagrams illustrating examples of the procedure of the process of manufacturing the semiconductor storage device according to the first embodiment.

As illustrated in FIG. 8A, with the above processing, each of the stair portions STRas and STRbs forms the stair portion corresponding to twelve steps which ascend in steps toward the memory portion MEM. In addition, the stair portion STRcs has each step constituted by three sets of the insulating layers IL and the sacrificial layers SC, and becomes a stair portion corresponding to four steps descending toward the memory portion MEM. As a result, the stair portion STRcs has a far steeper gradient than the stair portions STRas and STRbs. In this manner, the groove G is formed in the stacked body LMs such that the stair portion STRas and the stair portion STRcs face each other.

Here, assuming that a plurality of times of slimming performed using each resist pattern is one cycle, three cycles of slimming are performed using the three resist patterns 31 to 33 in the processing described so far.

In addition, if two cycles of slimming are performed using the two resist patterns 32 and 33 with the stair portions STRas, STRbs, and STRcs having equal steps and equal gradients as the initial state, three sets of the insulating layers IL and the sacrificial layers SC are included in one step of the stair portion STRcs when the insulating layer IL and the sacrificial layer SC included in one step of the stair portions STRas and STRbs correspond to, for example, one set. That is, when two cycles of slimming are performed, the difference in level of one step of the stair portion STRcs becomes three times the difference in level of one step of the stair portions STRas and STRbs.

When the above description is further generalized, the number of layers corresponding to one step of the stair portions STRas and STRbs is M layers, and the number of layers corresponding to one step of the stair portions STRcs is [(N+1)×M] layers if N cycles of slimming are performed with the stair portions STRas, STRbs, and STRcs having equal steps and equal gradients as the initial state.

After the processing of FIG. 8A, the resist pattern 33c is removed.

Figure 8B:
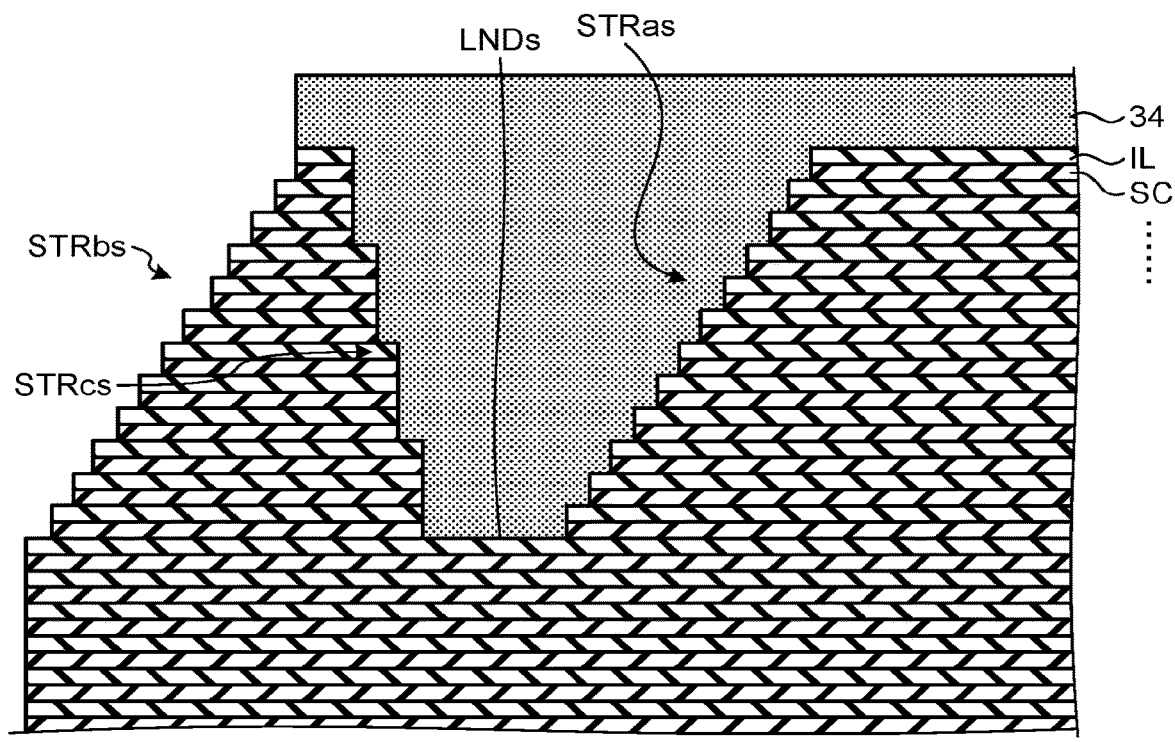

As illustrated in FIG. 8B, a resist pattern 34 is formed on the stacked body LMs to cover the entire area, which is to serve as the memory portion MEM, and partial areas of the stair portions STRas, STRbs, and STRcs.

In FIG. 8B, the resist pattern 34 extends in the depth direction of the paper surface, for example, by the width of the memory portion MEM. In addition, the resist pattern 34 covers from the uppermost step to the lowermost step of the stair portion STRas, and covers from the lowermost step to the uppermost step of the stair portion STRcs facing the stair portion STRas. Since the stair portion STRbs shares the uppermost step with the stair portion STRcs, lower steps of the second uppermost and subsequent steps are exposed in the stair portion STRbs.

Figure 9:
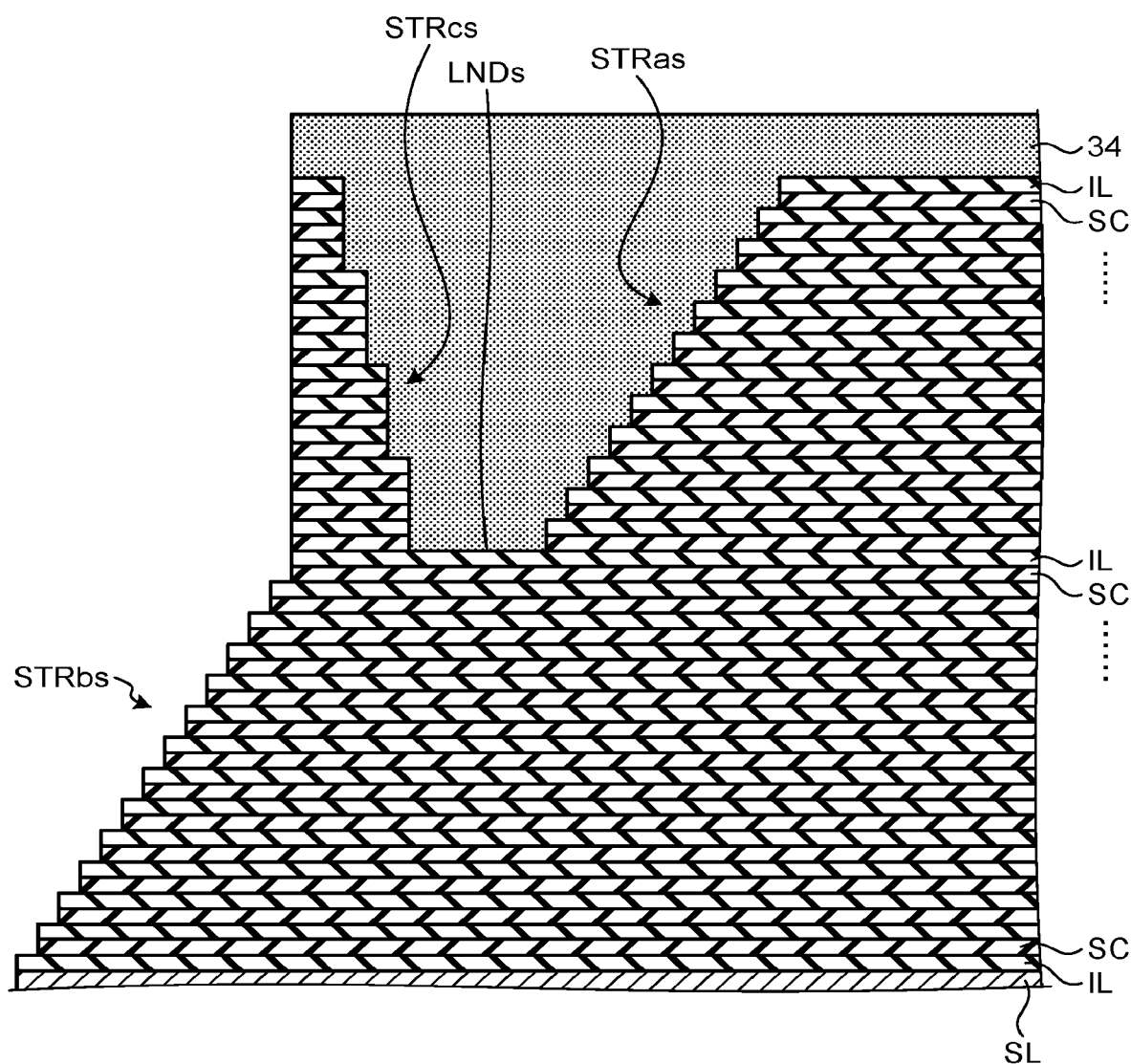
FIG. 9 is a flow diagram illustrating an example of the procedure of the process of manufacturing the semiconductor storage device according to the first embodiment.

As illustrated in FIG. 9, the number of layers equal to the number of the insulating layers IL and the sacrificial layers SC constituting the stair portion STRas, that is, twelve sets of the insulating layers IL and the sacrificial layers SC are removed from each of the exposed steps of the stair portion STRbs using the resist pattern 34 as a mask. In other words, the uppermost step of the stair portion STRbs is made to be the insulating layer IL and the sacrificial layer SC which are lower, by one set, than the insulating layer IL and the sacrificial layer SC constituting the landing portion LNDs. As a result, the stair portion STRbs is constituted by the insulating layer IL and the sacrificial layer SC which are layers lower than the insulating layer IL and the sacrificial layer SC constituting the stair portion STRas.

The process of lowering the stacking position of the stair portion STRbs more than the other stair portion STRa in this manner will be sometimes referred to as dropping of the stair portion STRbs hereinafter. As a result of such dropping, the stair portions STRas, STRbs, and STRcs having shapes substantially equal to the shapes of the above-described stair portions STRa, STRb, and STRc are formed.

After the processing of FIG. 9, the resist pattern 34 is removed.

Figure 10:
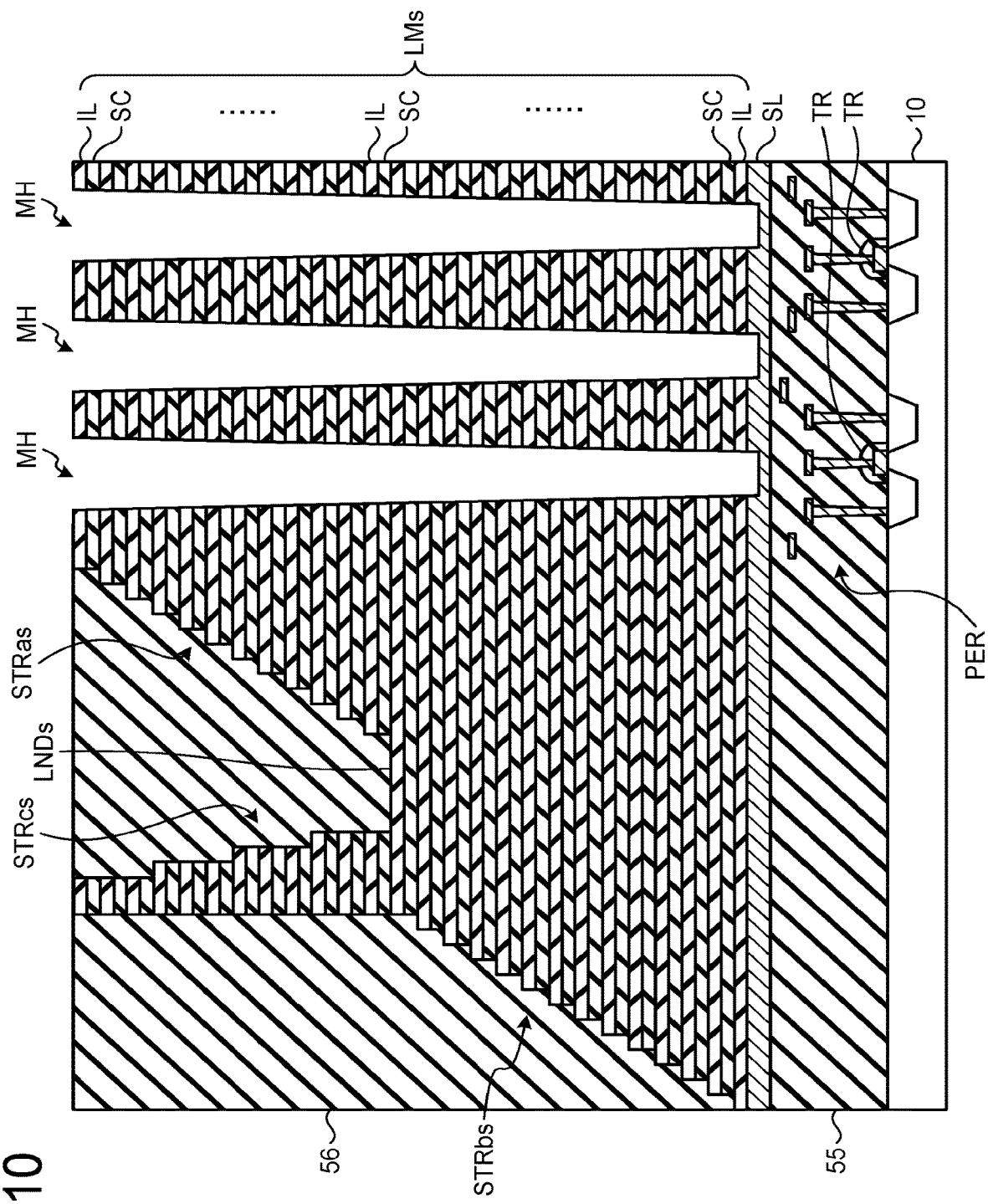
FIG. 10 is a flow diagram illustrating an example of the procedure of the process of manufacturing the semiconductor storage device according to the first embodiment.

As illustrated in FIG. 10, the insulating layer 56 covering the stair portions STRas, STRbs, and STRcs is formed up to a height of an upper surface of the stacked body LMs. In addition, a plurality of memory holes MH which penetrate through the stacked body LMs and reach the source line SL are formed.

Figure 11:
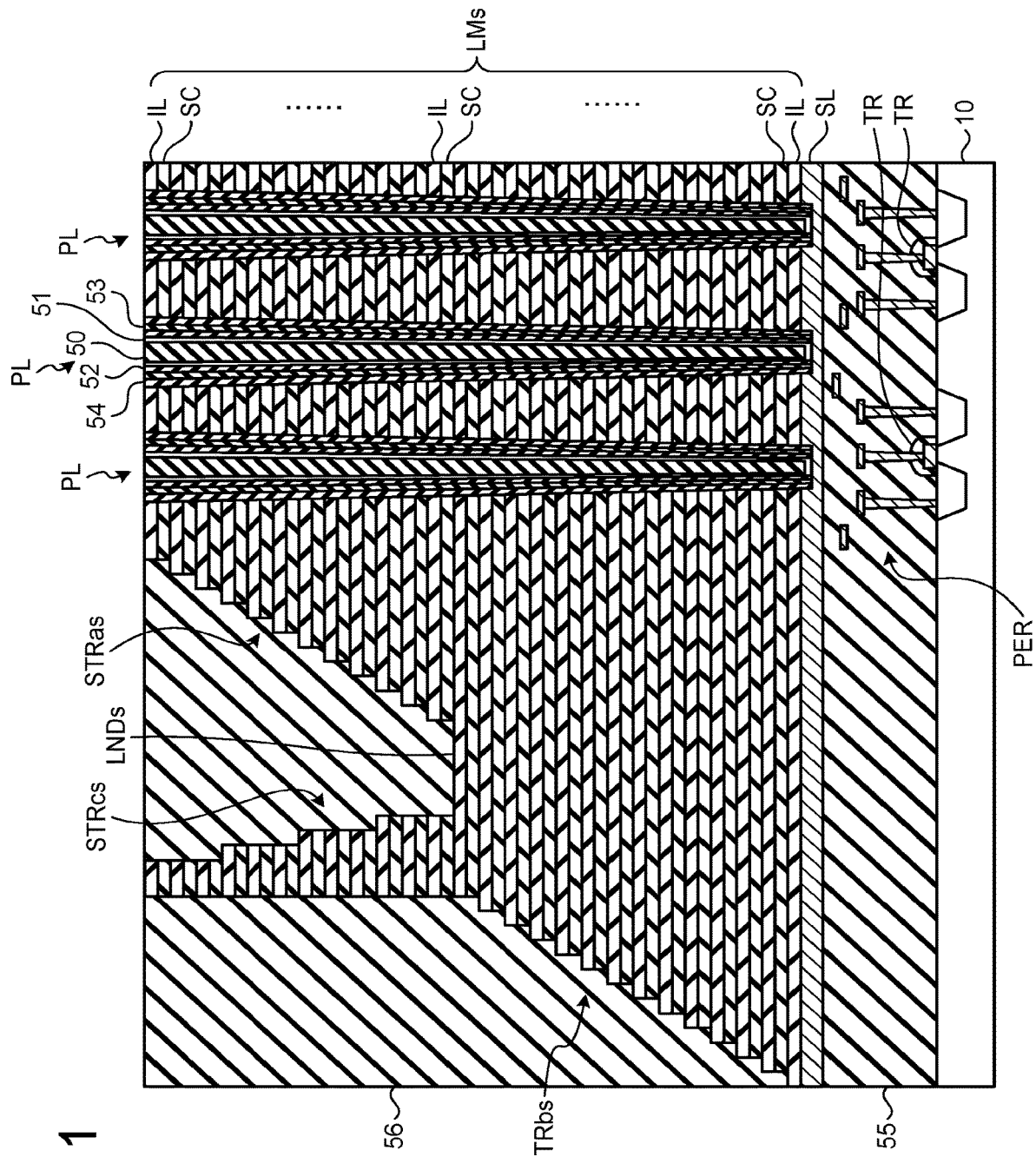
FIG. 11 is a flow diagram illustrating an example of the procedure of the process of manufacturing the semiconductor storage device according to the first embodiment.

As illustrated in FIG. 11, the block insulating layer 54, the charge storage layer 53, the tunnel insulating layer 52, and the channel layer 51 are formed in this order from an inner wall side of the memory hole MH in each of the memory holes MH. The channel layer 51 is also formed at the bottom of the memory hole MH. In addition, a gap inside the channel layer 51 is filled with the core layer 50. As a result, the plurality of pillars PL are formed.

A slit (not illustrated) which penetrates the stacked body LMs is formed. In FIG. 11, the slit extends in parallel with the paper surface.

Figure 12:
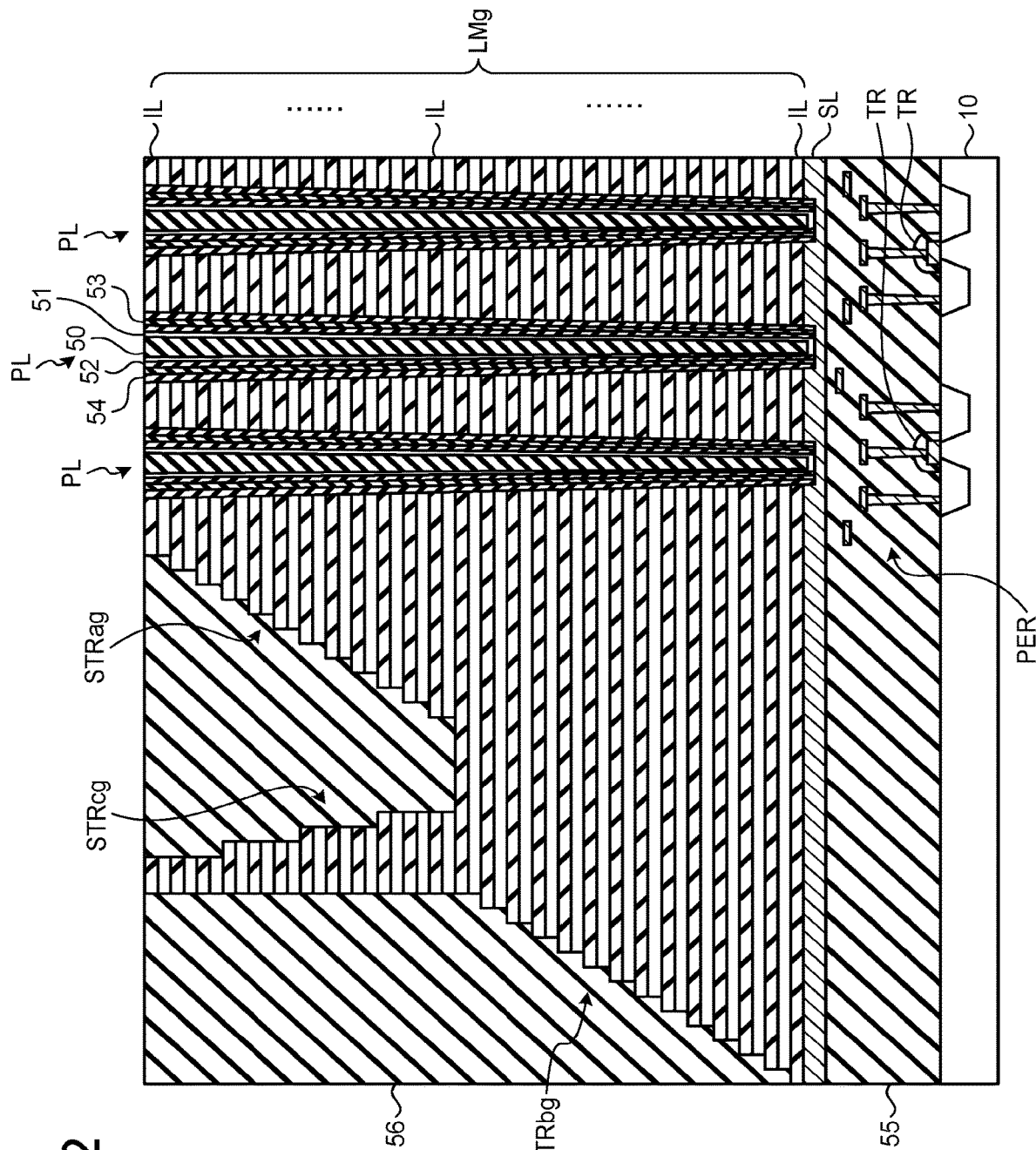
FIG. 12 is a flow diagram illustrating an example of the procedure of the process of manufacturing the semiconductor storage device according to the first embodiment.

As illustrated in FIG. 12, the sacrificial layer SC of the stacked body LMs is removed through the slit (not illustrated). As a result, a stacked body LMg having stair portions STRag, STRbg, and STRcg each including a gap between the insulating layers IL from which the sacrificial layer SC has been removed is formed.

Figure 13:
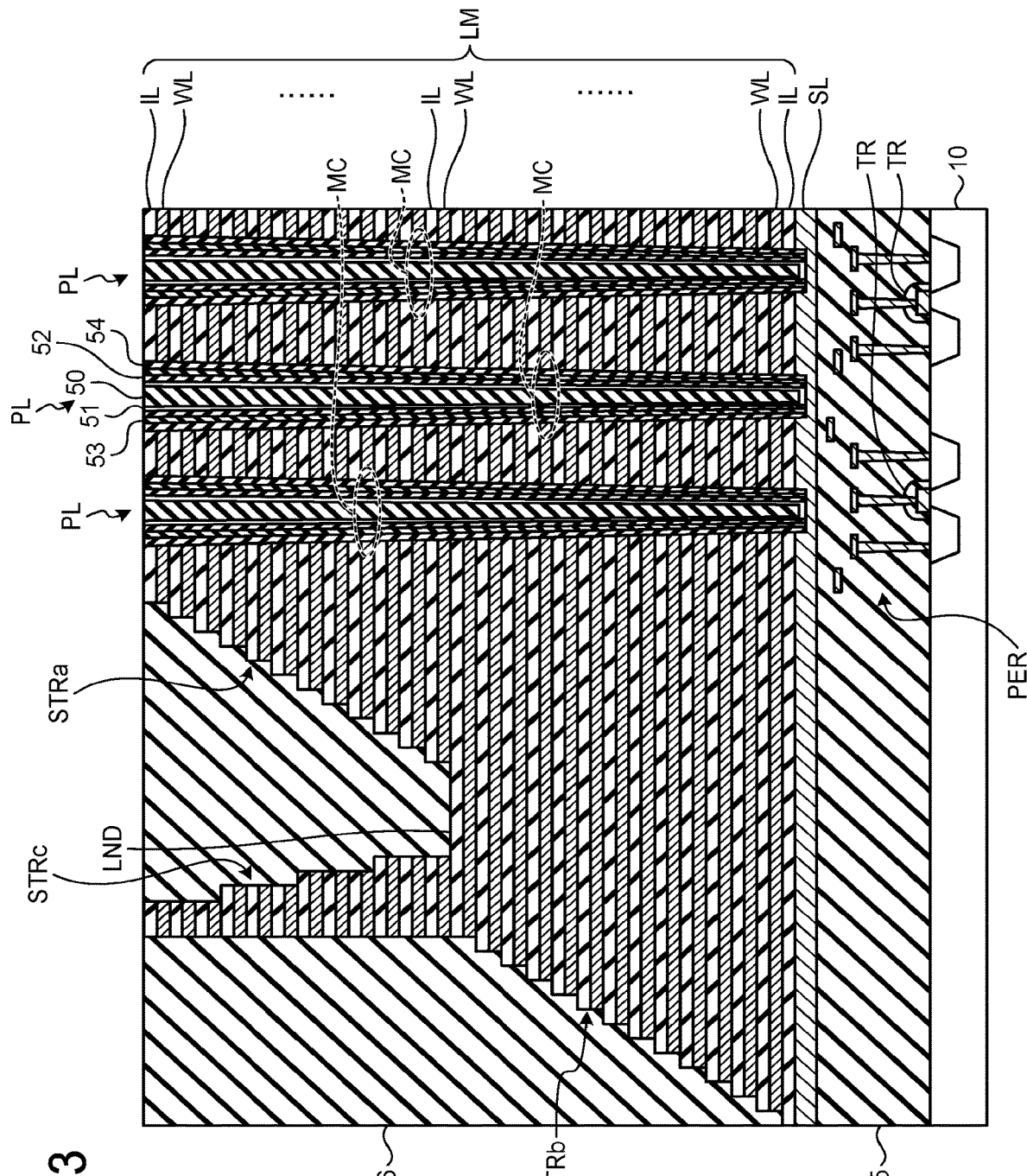
FIG. 13 is a flow diagram illustrating an example of the procedure of the process of manufacturing the semiconductor storage device according to the first embodiment.

As illustrated in FIG. 13, the gap between the insulating layers IL is filled with a conductive material such as tungsten and molybdenum through the slit (not illustrated). As a result, the stacked body LM having the stair portions STRa, STRb, and STRc in which the word line WL is stacked between the insulating layers IL is formed.

Thereafter, the contacts CC, connected to the word lines WL constituting the respective steps of the stair portions STRa and STRb and the landing portion LND, are formed.

As above, the process of manufacturing the semiconductor storage device 1 of the first embodiment is ended.

Comparative Example

Next, a semiconductor storage device of a comparative example will be described with reference to FIGS. 14A to 14E. FIGS. 14A to 14E are flow diagrams illustrating examples of a procedure of a process of manufacturing the semiconductor storage device according to the comparative example. However, some stages of the process of manufacturing the semiconductor storage device 1 of the first embodiment are illustrated on the right side of FIGS. 14A to 14E for the comparison.

Figure 14A:
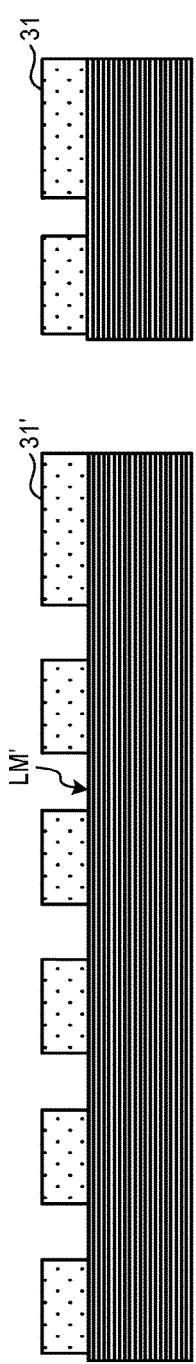
FIGS. 14A to 14E are flow diagrams illustrating examples of a procedure of a process of manufacturing a semiconductor storage device according to a comparative example.
Figure 14B:
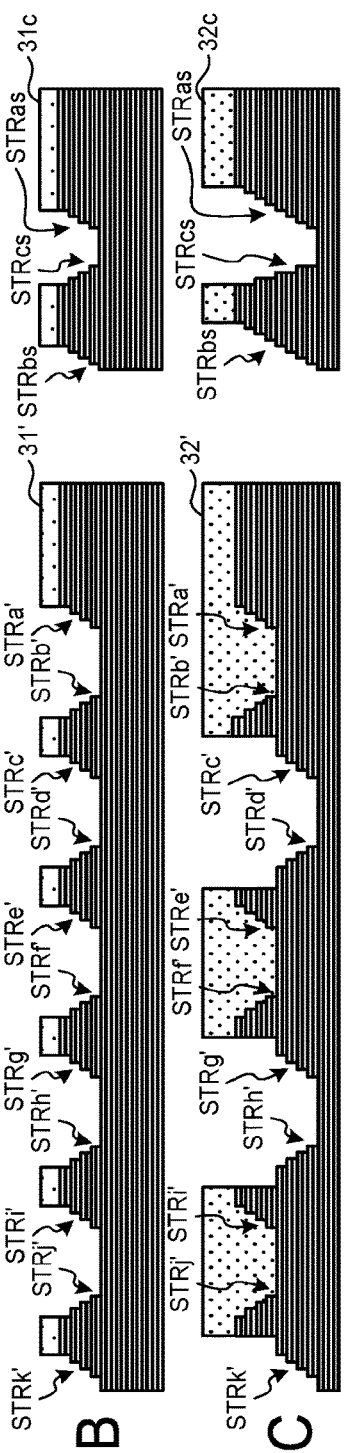
Figure 14C:
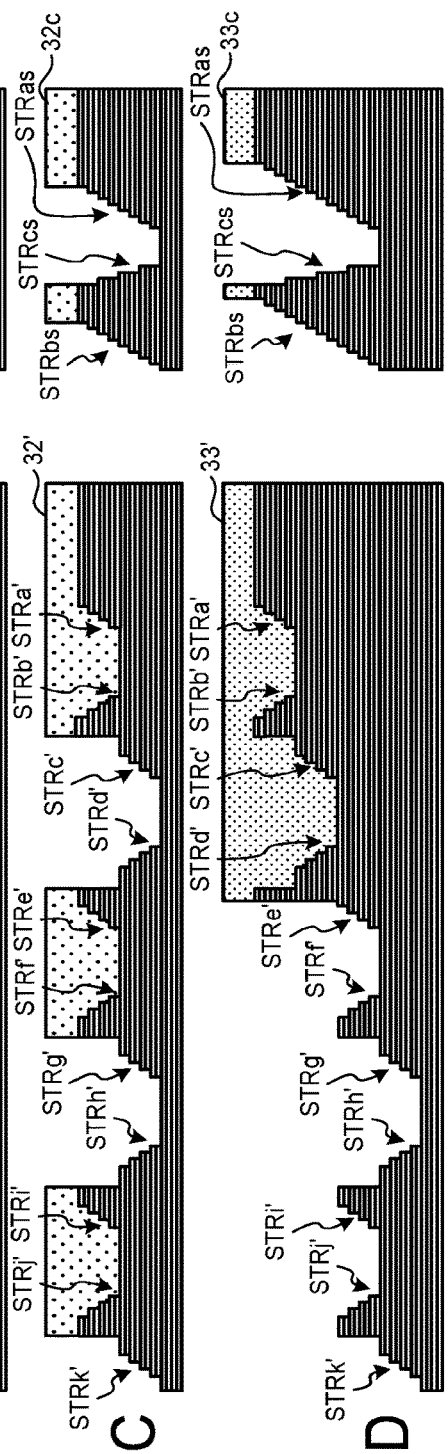
Figure 14D:
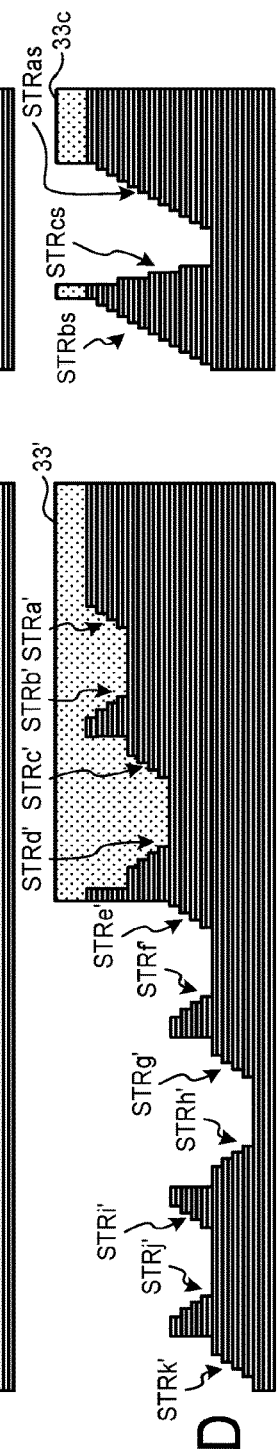
Figure 14E:
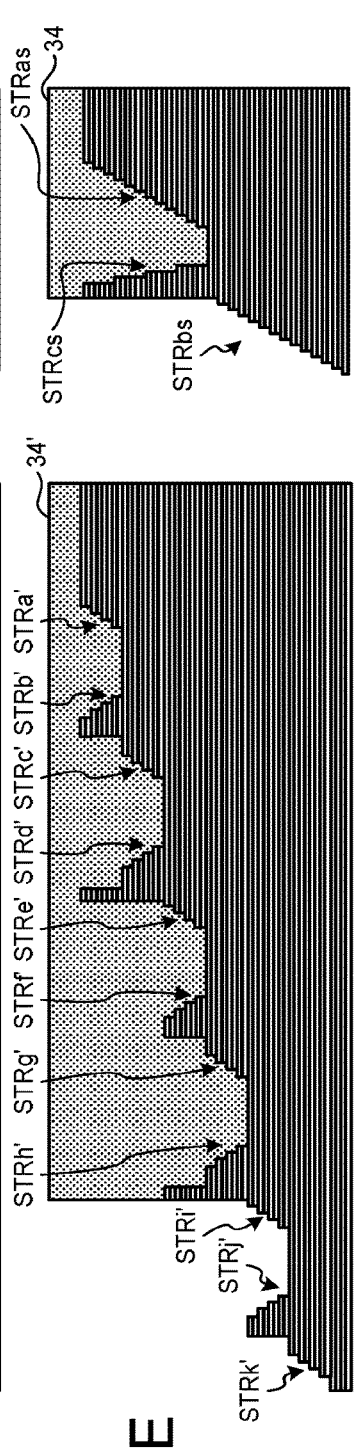

As illustrated in FIG. 14A, in the process of manufacturing the semiconductor storage device of the comparative example, a resist pattern 31' having five island portions is formed in an area where a stair portion of the stacked body LM' is formed. As illustrated in FIG. 14B, stair portions STRa' to STRk' having the same height and the same gradient are formed on both sides of the island portion while slimming the resist pattern 31'. As illustrated in FIG. 14C, the stair portions STRc' and STRd', the stair portions STRg' and STRh', and the stair portion STRk' are dropped relative to the stair portions STRa' and STRb', the stair portions STRe' and STRf', and the stair portions STRi' and STRj', respectively, using a resist pattern 32' as a mask. As illustrated in FIG. 14D, the stair portions STRe' to STRk' are dropped relative to the stair portions STRa' to STRd' using a resist pattern 33' as a mask. As illustrated in FIG. 14E, the stair portions STRi' to STRk' are dropped relative to the stair portions STRa' to STRh' using a resist pattern 34' as a mask. As described above, one cycle of slimming using the resist pattern 31' is performed, and three times of the dropping using the resist patterns 32' to 34' are performed, whereby the stair portions STRa' to STRk' of the comparative example are formed relatively easily.

Next, an issue of the semiconductor storage device of the comparative example will be described with reference to FIGS. 15A and 15B. FIGS. 15A and 15B are schematic views illustrating invalid areas IV of the semiconductor storage device according to the comparative example and the semiconductor storage device 1 according to the first embodiment;

As illustrated in FIG. 15A, in the semiconductor storage device of the comparative example, the stair portions STRb', STRd', STRf', STRh', and STRj' and landing portions connected thereto correspond to the invalid area IV which does not contribute to the function of the semiconductor storage device. In addition, gradients of the stair portions STRb', STRd', STRf', STRh', and STRj' belonging to the invalid area IV are gentle without being changed from the other stair portions having a function as a lead-out portions of word lines. Therefore, an occupancy rate of the invalid area IV in the stair portions STRa' to STRk' of the semiconductor storage device of the comparative example exceeds, for example, 50%, and may be about 75% depending on a design of a stair portion.

As illustrated in FIG. 15B, the landing portion LND excluding a connection area between the stair portion STRc and the contact CC corresponds to the invalid area IV in the semiconductor storage device 1 of the first embodiment. In addition, the gradient of the stair portion STRc belonging to the invalid area IV is larger than those of the other stair portions STRa and STRb having the function as the lead-out portions of the word lines WL. Therefore, an occupancy rate of the invalid area IV in the stair portions STRa, STRb, and STRc of the semiconductor storage device 1 of the first embodiment can be suppressed to, for example, 50% or less. In addition, a total length of the stair portions STRa, STRb, and STRc of the first embodiment is 50% or less relative to the stair portions STRa' to STRk' of the comparative example, and about 30% depending on designs of the stair portions STRa, STRb, and STRc.

As described above, the area occupied by the stair portions STRa, STRb, and STRc can be reduced according to the semiconductor storage device 1 of the first embodiment. As a result, an occupancy rate of the memory portion MEM in the semiconductor storage device 1 can be increased. In addition, the semiconductor storage device 1 can be miniaturized.

According to the semiconductor storage device 1 of the first embodiment, the respective steps of the stair portions STRas, STRbs, and STRcs, which are predecessors of the stair portions STRa, STRb, and STRc, are formed in parallel using the resist patterns 31 to 33. As a result, the stair portions STRa, STRb, and STRc can be easily formed without making the manufacturing process complicated.

Incidentally, the uppermost step of the stair portion STRb is one step lower than the landing portion LND in the above-described first embodiment, but these steps may be in the same layer. In this case, the contact CC connected to the word line WL belonging to the layer may be arranged at either the uppermost step of the stair portion STRb or the landing portion LND.

Second Embodiment

In the semiconductor storage device 1 of the first embodiment, the gradient of the stair portion STRc is made larger than the gradients of the stair portions STRa and STRb without changing the width of the terrace surface TRC by increasing the number of layers per step of the stair portion STRc, which is the dummy stair, more than those of the other stair portions STRa and STRb.

In a second embodiment, the number of layers per step of a dummy stair is made equal to that of the other stairs, and then, a width of a terrace surface is changed to make a gradient of the dummy stair larger than those of the other stairs. Hereinafter, the second embodiment will be described with reference to the drawings.

(Configuration Example of Semiconductor Storage Device)

Figure 16:
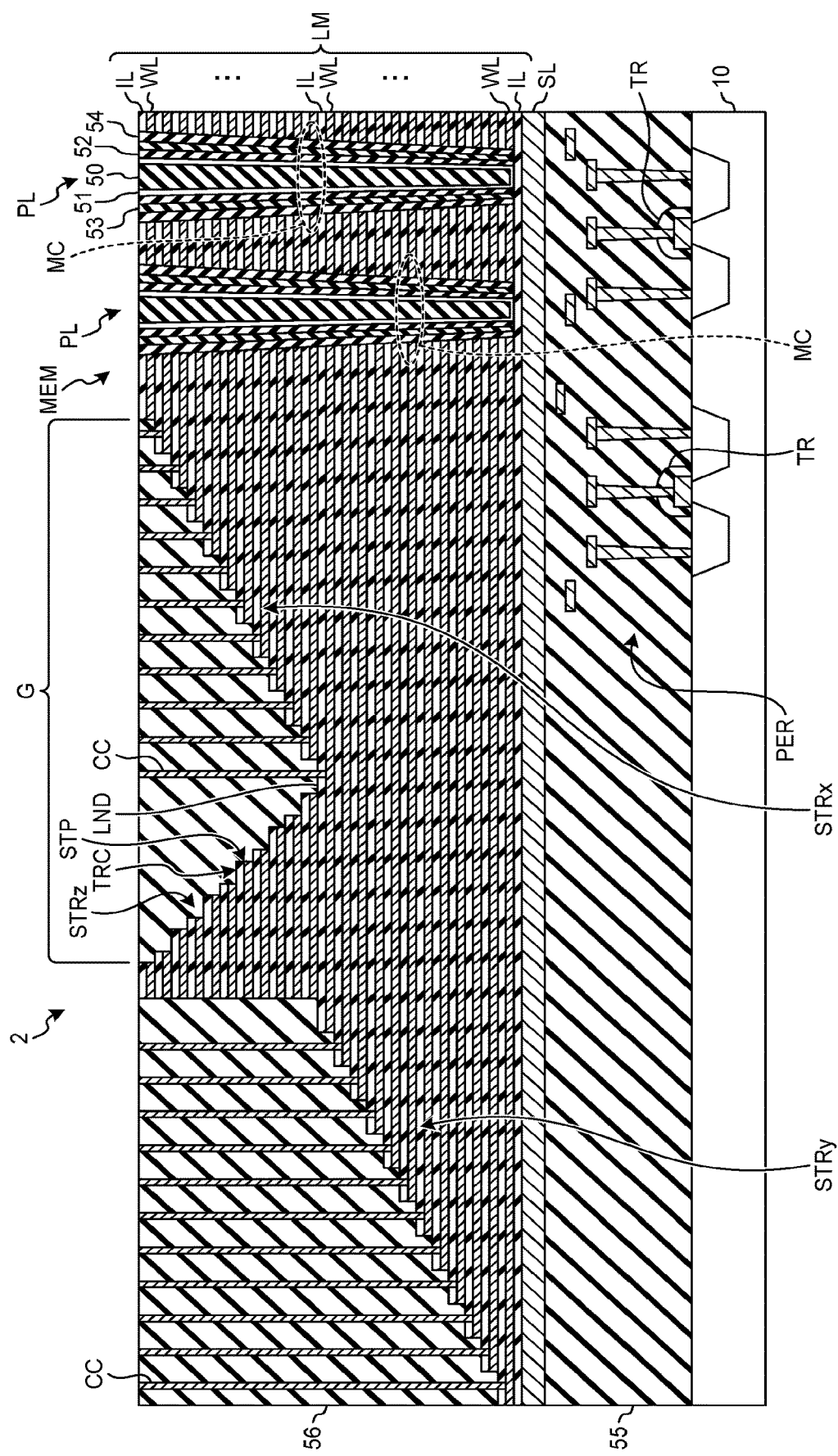
FIG. 16 is a cross-sectional view schematically illustrating a configuration example of a semiconductor storage device according to a second embodiment.
Figure 17:
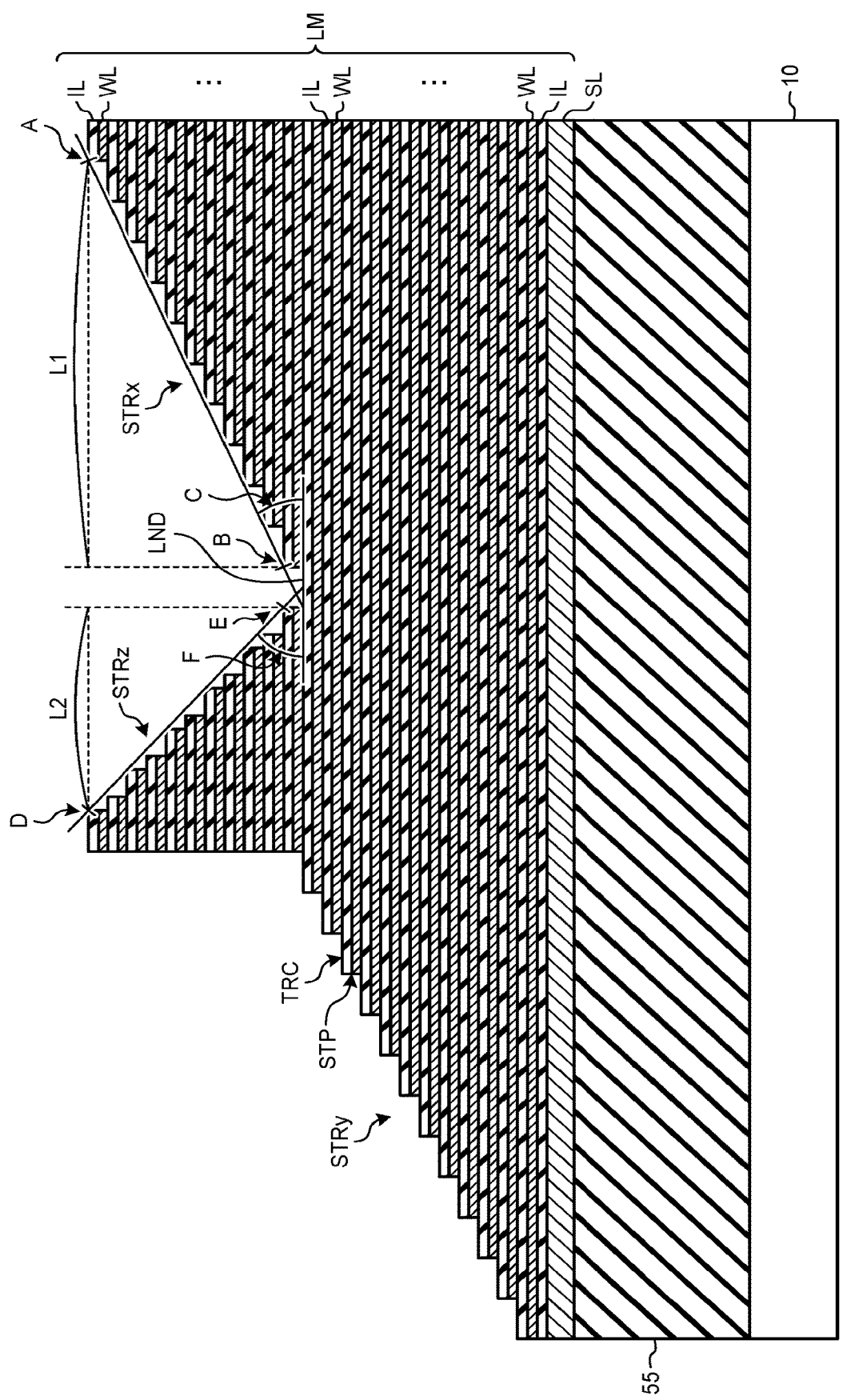
FIG. 17 is a cross-sectional view schematically illustrating the configuration example of the semiconductor storage device according to the second embodiment.

FIGS. 16 and 17 are cross-sectional views schematically illustrating a configuration example of a semiconductor storage device 2 according to the second embodiment. FIG. 16 is the cross-sectional view including the memory portion MEM, stair portions STRx, STRy, and STRz, and the peripheral circuit PER. FIG. 17 is the enlarged cross-sectional view in the vicinity of the stair portions STRx, STRy, and STRz.

The stair portions STRx, STRy, and STRz in which the word line WL and the insulating layer IL are formed in a stair shape are arranged at an end of the stacked body LM as illustrated in FIG. 16. Among these, the stair portion STRz is a dummy stair in which the word lines WL constituting itself are not connected to the memory cells MC.

The stair portion STRx, which is a first stair portion, has a similar configuration to the stair portion STRa of the first embodiment. That is, the stair portion STRx constituted by the word lines WL and the insulating layers IL in an upper layer part of the stacked body LM is arranged closest to the memory portion MEM, and is configured to ascend in steps toward the memory portion MEM. One step of the stair portion STRx is constituted by, for example, one layer of the word line WL and one layer of the insulating layer IL which is the upper layer of the one layer of the word line WL.

The stair portion STRy, which is a second stair portion, has a similar configuration to the stair portion STRb of the first embodiment. That is, the stair portion STRy constituted by the word lines WL and the insulating layers IL in a lower layer part of the stacked body LM is arranged at a position farthest from the memory portion MEM, and is configured to ascend in steps toward the memory portion MEM. One step of the stair portion STRy is constituted by, for example, one layer of the word line WL and one layer of the insulating layer IL which is the upper layer of the one layer of the word line WL.

The stair portion STRz, which is a third stair portion, is arranged between the stair portions STRx and STRy, and is configured to descend in steps toward the memory portion MEM. The stair portion STRz includes at least some of the word lines WL and the insulating layers IL located at the same stacking positions as each layer of the stair portion STRx. The stair portions STRx and STRz face each other, and the groove G is provided between the stair portions STRx and STRz, and the landing portion LND is arranged at the bottom of the groove G as a connection portion connecting the lowermost steps therebetween. Ideally, one step of the stair portion STRz is constituted by, for example, one layer of the word line WL and one layer of the insulating layer IL which is the upper layer of the one layer of the word line WL.

Incidentally, the insulating layer IL and the word line WL constituting the uppermost step of the stair portion STRy are the same layer as the insulating layer IL and the word line WL of the landing portion LND in the example of FIG. 16. Thus, the contact CC is arranged only in the landing portion LND, and the uppermost step of the stair portion STRy does not have the contact CC. However, the contact CC may be arranged in reverse.

In addition, a pair of the insulating layer IL and the word line WL including the word line WL in the lowermost layer of the stacked body LM extends also from a lower end of the lowermost step in the stair portion STRy. The contact CC is also connected to this word line WL.

Widths of the terrace surfaces TRC of the respective steps of the stair portion STRx are, for example, substantially equal. Widths of the terrace surfaces TRC of the respective steps of the stair portion STRy are, for example, substantially equal. The widths of the terrace surfaces TRC of the stair portions STRx and STRy are, for example, substantially equal to each other.

Widths of the terrace surfaces TRC of the respective steps of the stair portion STRz differ every other step, and differ from the width of the terrace surface TRC in the stair portions STRx and STRy. Ideally, the width of the terrace surface TRC of the stair portion STRz is, for example, alternately ⅓ or ⅔ of each width of the terrace surface TRC of the stair portions STRx and STRy. Thus, the stair portion STRz generally has a steeper gradient than the stair portions STRx and STRy.

However, such configurations relating to the stair portion STRz are examples in a case where a manufacturing process to be described later is ideally performed, and are not necessarily applied to the actual stair portion STRz in some cases.

Even in the configuration of the second embodiment, the gradients and stair lengths of the stair portions STRx, STRy, and STRz follow the same definitions as those of the first embodiment described above. A specific example is illustrated in FIG. 17.

As illustrated in FIG. 17, the gradient of the stair portion STRx is defined as follows. An angle C between an extension of a virtual straight line A-B between an upper end A of the uppermost step and an upper end B of the lowermost step of the stair portion STRx and an upper surface of the landing portion LND below the stair portion STRx with which a lower end of the lowermost step of the stair portion STRx is in contact is defined as the gradient of the stair portion STRx.

In addition, the stair length of the stair portion STRx is defined as follows. A horizontal distance L1 between the upper end A of the uppermost step and the upper end B of the lowermost step of the stair portion STRx in a direction from an arrangement position of the stair portion STRx to an arrangement position of the memory portion MEM is defined as the stair length of the stair portion STRx.

The gradient of the stair portion STRz is defined as follows similarly to the above description. An angle F between an extension of a virtual straight line D-E between an upper end D of the uppermost step and an upper end E of the lowermost step of the stair portion STRz and an upper surface of the landing portion LND below the stair portion STRz with which a lower end of the lowermost step of the stair portion STRz is in contact is defined as the gradient of the stair portion STRz.

In addition, the stair length of the stair portion STRz is defined as follows similarly to the above description. A horizontal distance L2 between the upper end D of the uppermost step and the upper end E of the lowermost step of the stair portion STRz in a direction from an arrangement position of the stair portion STRz to the arrangement position of the memory portion MEM is defined as the stair length of the stair portion STRz.

According to the above definition, the following can be said regarding the stair portions STRx and STRz. The gradient of the stair portion STRx is smaller than the gradient of the stair portion STRz. The stair length of the stair portion STRx is longer than the stair length of the stair portion STRz. More simply, the distance between the upper end A of the uppermost step and the upper end B of the lowermost step of the stair portion STRx is longer than the distance between the upper end D of the uppermost step and the upper end E of the lowermost step of the stair portion STRz. The above relationship of the distance of the virtual straight line A-B of the stair portion STRx and the distance of the virtual straight line D-E of the stair portion STRz is maintained, for example, even when the gradients of the stair portions STRx and STRz change in somewhere of the halfway of either of the stair portions STRx and STRz from the view of the manufacturing process.

In addition, the following can be said, in principle, regarding the stair portions STRx and STRy in light of the process of manufacturing the semiconductor storage device 2 to be described later. The gradient of the stair portion STRy is substantially equal to the gradient of the stair portion STRx. The stair length of the stair portion STRy is substantially equal to the stair length of the stair portion STRx. More simply, the distance between an upper end of the uppermost step and an upper end of the lowermost step of the stair portion STRy is substantially equal to the distance between the upper end A of the uppermost step and the upper end B of the lowermost step of the stair portion STRx.

(Example of Process of Manufacturing Semiconductor Storage Device)

Next, an example of the process of manufacturing the semiconductor storage device 2 according to the second embodiment will be described with reference to FIGS. 18A to 20B. FIGS. 18A to 20B are flow diagrams illustrating examples of a procedure of the process of manufacturing the semiconductor storage device 2 according to the second embodiment. Some configurations such as a lower layer structure of the stacked body LMs and the memory portion MEM are sometimes omitted in FIGS. 18A to 20B.

First, the peripheral circuit PER, the source line SL, and the stacked body LMs are formed on the substrate 10. The stacked body LMs has a configuration in which the plurality of sacrificial layers SC and insulating layers IL are alternately stacked.

A stair-like structure is formed in the stacked body LMs while slimming a resist pattern similarly to FIGS. 2B to 4C of the first embodiment described above.

Figure 18A:
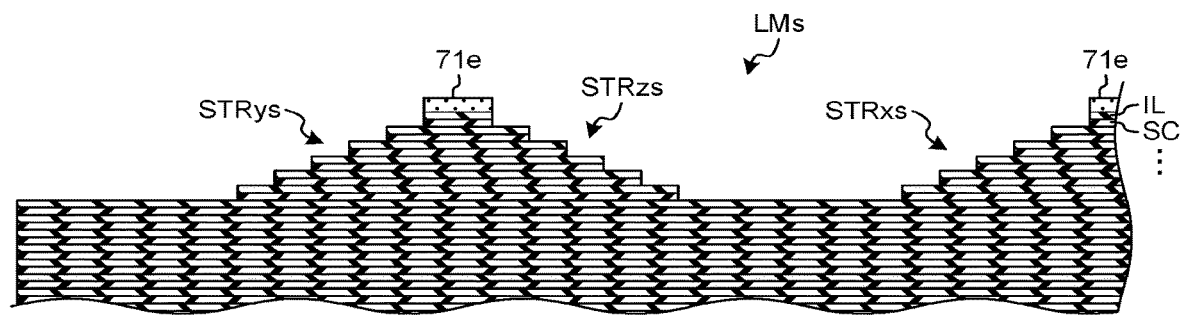
FIGS. 18A to 18C are flow diagrams illustrating examples of a procedure of a process of manufacturing the semiconductor storage device according to the second embodiment.

FIG. 18A illustrates a state in which the stacked body LMs is processed using a resist pattern 71e, which has been slimmed five times, for example, as a mask. As illustrated in FIG. 18A, stair portions STRxs, STRys, and STRzs each having six steps are formed in the stacked body LMs.

Figure 18B:
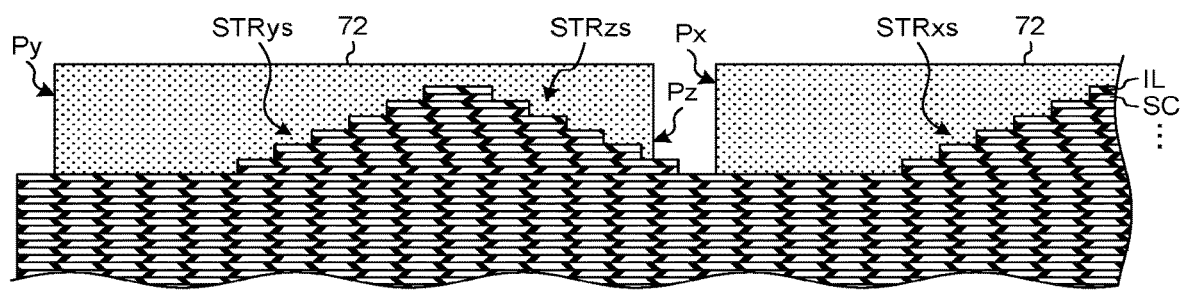

As illustrated in FIG. 18B, the resist pattern 71e is removed, and then, a resist pattern 72 is formed on the stacked body LMs.

An end Px of the resist pattern 72 is extended by a multiple of the width of the terrace surface TRC from the lowermost step surface STP of the stair portion STRxs formed last in FIG. 18A in the opposite direction to the side where the memory portion MEM is present.

An end Py of the resist pattern 72 is extended by a multiple of the width of the terrace surface TRC from the lowermost step surface STP of the stair portion STRys formed last in FIG. 18A in the opposite direction to the side where the memory portion MEM is present.

An end Pz of the resist pattern 72 covers the lowermost terrace surface TRC of the stair portion STRzs formed last in FIG. 18A by ⅓ of the width. That is, the resist pattern 72 covers the entire stair portion STRz except ⅔ of a distal end of the terrace surface TRC of the lowermost step.

Figure 18C:
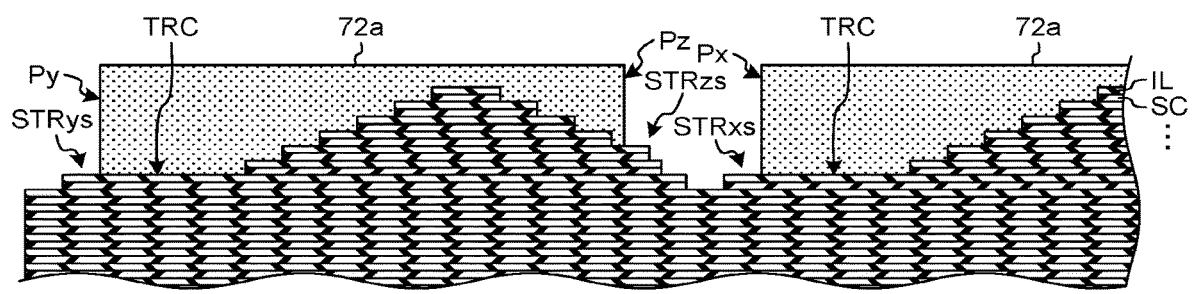

As illustrated in FIG. 18C, one step of the stacked body LMs, that is, one pair of the insulating layer IL and the sacrificial layer SC is removed using the resist pattern 72 as a mask, and then, the resist pattern 72 is slimmed to form a resist pattern 72a.

With the processing using the resist pattern 72, the lowermost step with the terrace surface TRC having a width equal to a multiple of a width of the other steps is formed in the stair portions STRxs and STRys. In addition, a lowermost step with the terrace surface TRC whose width is ⅔ of the width of the other steps and a step, which is an upper step of the lowermost step and has the terrace surface TRC whose width is ⅓ of the width of the other steps, are formed in the stair portion STRzs.

With the slimming of the resist pattern 72, the resist pattern 72a has the ends Px and Py which are retracted in the direction of the memory portion MEM by the width of the terrace surface TRC of the stair portions STRxs and STRys.

At this time, the end Pz of the resist pattern 72a is retracted in the opposite direction to the memory portion MEM by the same width as the ends Px and Py, that is, by the width of the terrace surface TRC. Since the end Pz of the resist pattern 72 originally covers only ⅓ of the lowermost terrace surface TRC, the end Pz of the resist pattern 72a, which has been retracted by the width of the terrace surface TRC, covers the terrace surface TRC of the third lowermost step of the stair portion STRzs by ⅓ of the width. That is, the resist pattern 72a covers the entire stair portion STRz except ⅔ of a distal end of the terrace surface TRC of the third lowermost step and the subsequent steps.

Figure 19A:
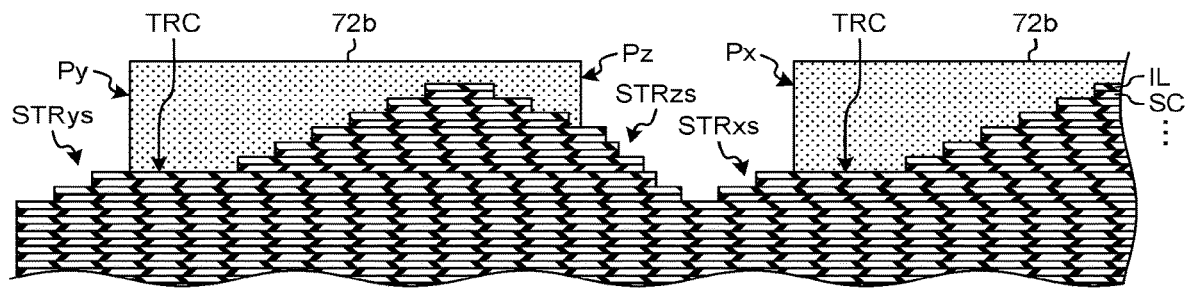
FIGS. 19A to 19C are flow diagrams illustrating examples of the procedure of the process of manufacturing the semiconductor storage device according to the second embodiment.

As illustrated in FIG. 19A, one step of the stacked body LMs is removed using the resist pattern 72a as a mask, and then, the resist pattern 72a is slimmed to form a resist pattern 72b.

With the processing using the resist pattern 72a, a lowermost step with the terrace surface TRC having the width equal to that of the other steps and a step, which is an upper step of the lowermost step and has the terrace surface TRC whose width is a multiple of that of the other steps, are formed in the stair portions STRxs and STRys In addition, in the stair portion STRzs, steps each having the terrace surface TRC whose width is ⅔ of that of the other steps, the terrace surface TRC whose width is ⅓ of that of the other steps, the terrace surface TRC whose width is ⅔ of that of the other steps, and the terrace surface TRC whose width is ⅓ of that of the other steps are formed in this order from the lowermost step.

With the slimming of the resist pattern 72, the ends Px and Py of the resist pattern 72b are retracted in the direction of the memory portion MEM by the width of the terrace surface TRC of the stair portions STRxs and STRys. The end Pz of the resist pattern 72b covers the terrace surface TRC of the fifth lowermost step of the stair portion STRzs by ⅓ of the width.

Figure 19B:
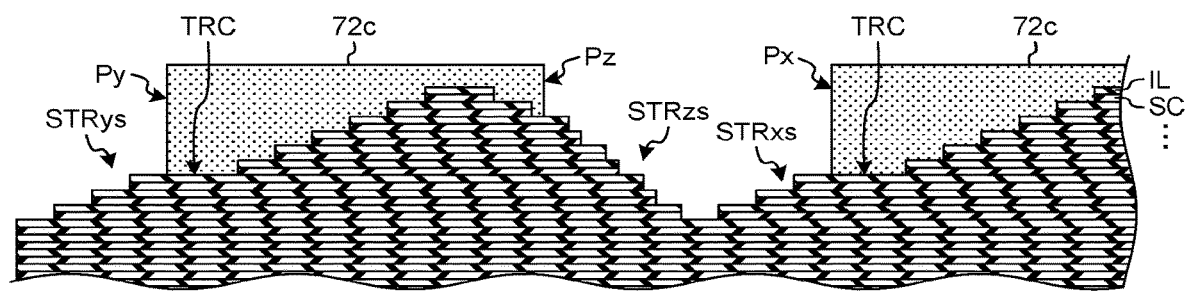

As illustrated in FIG. 19B, one step of the stacked body LMs is removed using the resist pattern 72b as a mask, and then, the resist pattern 72b is slimmed to form a resist pattern 72c.

As a result, the third lowermost step in the stair portions STRxs and STRys has the terrace surface TRC having the width equal to a multiple of that of the other steps. In addition, six steps are formed in the stair portion STRzs, the step alternately having the terrace surface TRC whose width is ⅔ of that of the other steps and the terrace surface TRC whose width is ⅓ of that of the other steps.

The ends Px and Py of the resist pattern 72c are retracted in the direction of the memory portion MEM by the width of the terrace surface TRC of the stair portions STRxs and STRys. The end Pz of the resist pattern 72c covers the terrace surface TRC of the seventh lowermost step of the stair portion STRzs by ⅓ of the width.

Figure 19C:
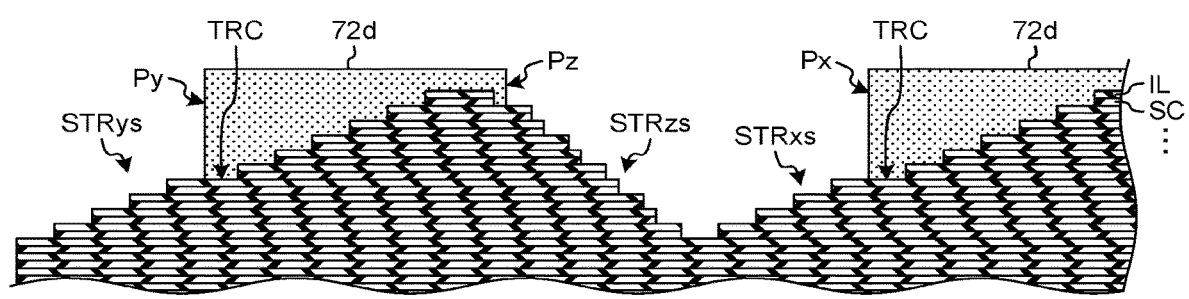

As illustrated in FIG. 19C, one step of the stacked body LMs is removed using the resist pattern 72c as a mask, and then, the resist pattern 72c is slimmed to form a resist pattern 72d. The obtained results are similar to those described above.

Figure 20A:
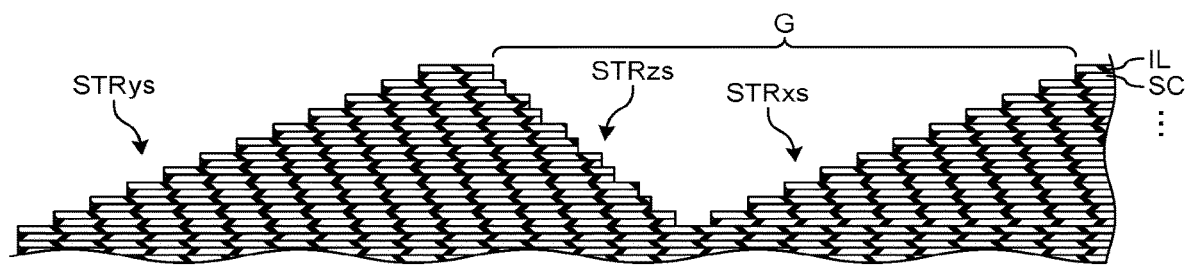
FIGS. 20A and 20B are flow diagrams illustrating examples of the procedure of the process of manufacturing the semiconductor storage device according to the second embodiment.

As illustrated in FIG. 20A, one step of the stacked body LMs is removed using the resist pattern 72d as a mask to form the stair portions STRxs and STRys in which the widths of the terrace surfaces TRC of the respective steps are equal. In addition, the stair portion STRzs is formed to alternately have steps in which the width of the terrace surface TRC is ⅔ or ⅓ of that of the stair portions STRxs and STRys. In addition, the groove G is formed in the stacked body LMs such that the stair portion STRxs and the stair portion STRzs face each other.

Figure 20B:
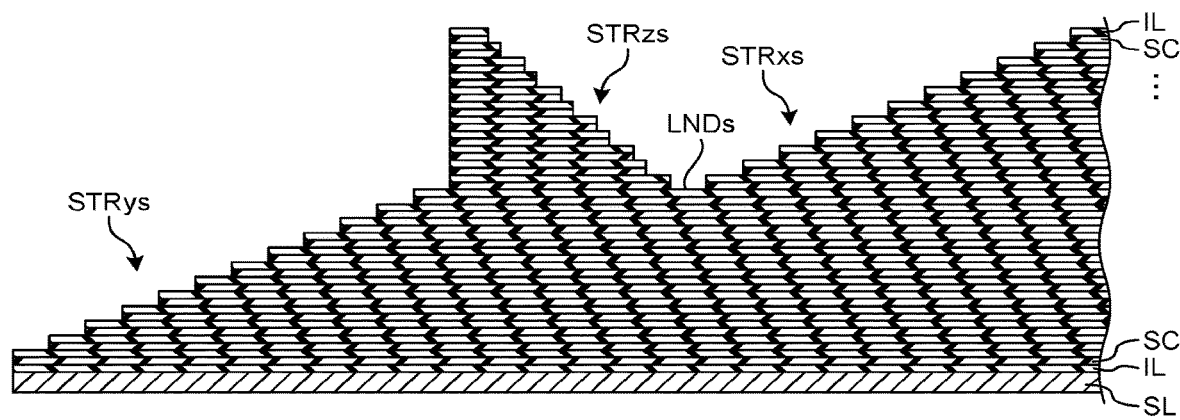

As illustrated in FIG. 20B, the stair portion STRys is dropped to lower the stacking position of the stair portion STRys more than the other stair portions STRxs and STRzs. At this time, the stair portion STRys is dropped, for example, such that the uppermost step of the stair portion STRys is constituted by the same insulating layer IL and sacrificial layer SC as the landing portion LNDs between the stair portions STRxs and STRzs.

Thus, the stair portions STRxs, STRys, and STRzs having shapes substantially equal to the shapes of the above-described stair portions STRx, STRy, and STRz are formed. Thereafter, the semiconductor storage device 2 of the second embodiment is manufactured by forming the pillars PL, replacing the sacrificial layers SC with the word lines WL, forming the contacts CC, and the like similarly to the above-described first embodiment.

According to the semiconductor storage device 2 of the second embodiment, the same effects as those of the semiconductor storage device 1 of the first embodiment can be obtained.

(Modification)

In the second embodiment described above, the ends Px and Py of the resist pattern 72 are pushed up in the opposite direction of the memory portion MEM to form the respective steps of the stair portions STRxs and STRys from the lower step side. However, resist pattern ends for the stair portions STRxs and STRys may be arranged similarly to the first embodiment. That is, the resist pattern ends may be arranged at positions retracted by the width of the terrace surface TRC from the uppermost steps of the stair portions STRxs and STRys formed in FIG. 18A to form the stair portions STRxs and STRys from the upper step side to the lower step side.

Although the height of the uppermost step of the stair portion STRy is set to be the same as the height of the landing portion LND in the above-described second embodiment, the height of the uppermost step of the stair portion STRy may be lowered by one step from the height of the landing portion LND similarly to the first embodiment. The height of the uppermost step of the stair portion STRy can be adjusted when dropping the stair portion STRys.

Figure 21A:
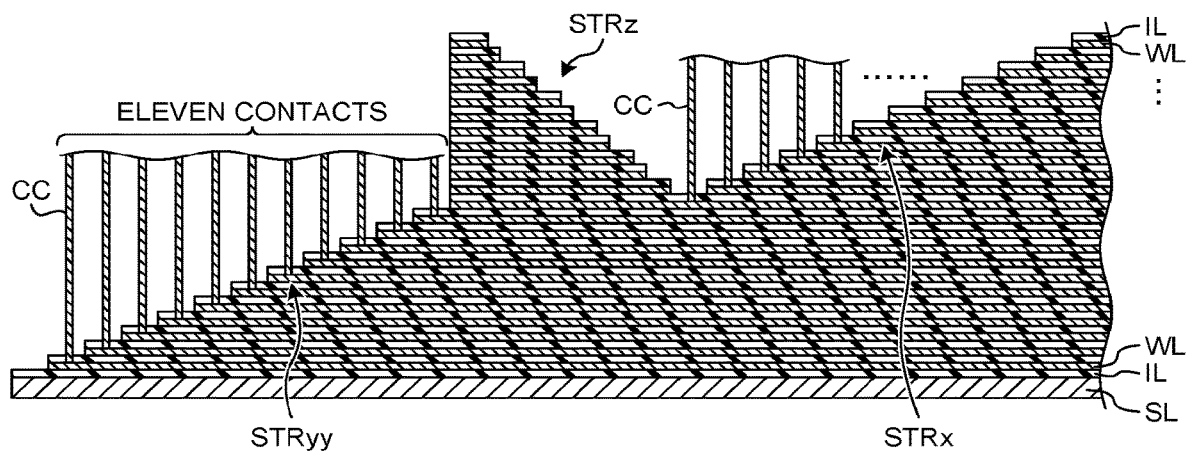
FIGS. 21A and 21B are cross-sectional views schematically illustrating configuration examples of a semiconductor storage device according to a modification of the second embodiment.
Figure 21B:
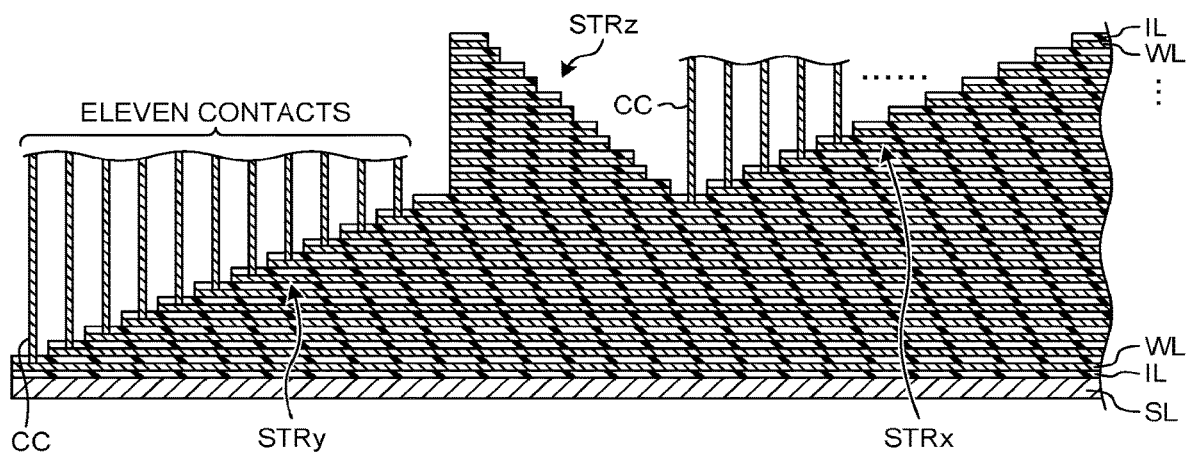

FIG. 21A illustrates a stair portion STRyy whose uppermost step is constituted by the insulating layer IL and the word line WL one layer lower than the landing portion LND. In this case, the contacts CC are also arranged at the uppermost step of the stair portion STRyy in addition to the contacts CC at the landing portion LND. However, the total number of the contacts CC provided in the stair portion STRyy is not different from that of the stair portion STRy having no contact CC in the uppermost step described above as illustrated also in FIG. 21B.

Third Embodiment

When actually applying the configurations of the first and second embodiments described above, it is also necessary to consider reinforcement of the stacked body LMg (see FIG. 12) having the gap from which the sacrificial layer SC has been removed at the time of replacement. A configuration of a third embodiment including a reinforcing member of the stacked body LMg is illustrated in FIGS. 22A and 22B.

Figure 22A:
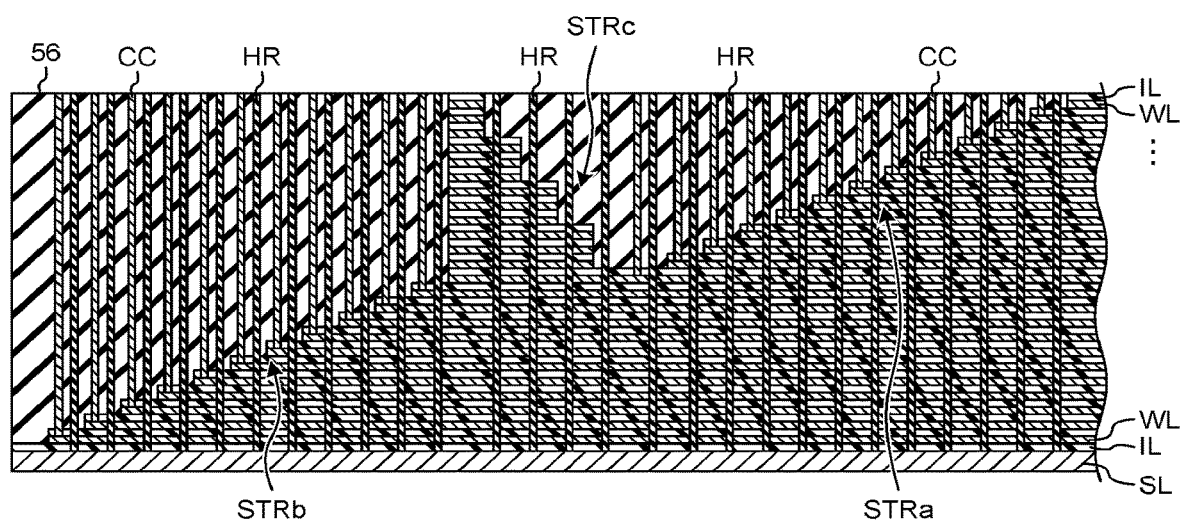
FIGS. 22A and 22B are cross-sectional views schematically illustrating configuration examples of a semiconductor storage device according to a third embodiment.
Figure 22B:
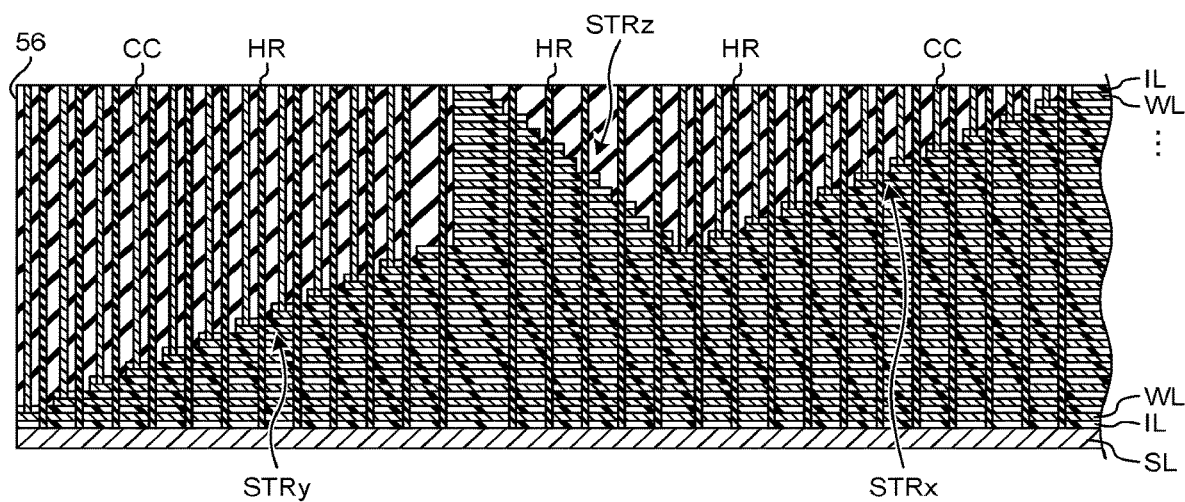

FIGS. 22A and 22B are cross-sectional views schematically illustrating configuration examples of a semiconductor storage device according to the third embodiment. FIG. 22A is based on the configuration of the semiconductor storage device 1 of the first embodiment. FIG. 22B is based on the configuration of the semiconductor storage device 2 of the second embodiment.

As illustrated in FIGS. 22A and 22B, not only the contacts CC but also columnar portions HR are arranged in the respective steps of the stair portions STRa to STRc and STRx to STRz. The columnar portions HR are made of, for example, an insulating layer including at least one of a $SiO_2$ layer and a SiN layer or the like, and penetrate through the respective layers of the stair portions STRa to STRc and STRx to STRz from the upper surface of the insulating layer 56 covering the stair portions STRa to STRc and STRx to STRz and reach the source line SL.

The columnar portion HR is formed before the processing to replace the sacrificial layer SC with the word line WL. The columnar portion HR may be formed, for example, in parallel with the pillar PL. Since the columnar portion HR is formed before the replacement, the stacked body LMg having a gap at the time of replacement is supported by the columnar portion HR.

Meanwhile, various other studies have been conducted in order to further reduce a stair length of a stair portion from which a word line is led out. An example thereof is a multi-row stair structure configured not only to ascend or descend with respect to a direction of a memory portion but also to ascend or descend with respect to a direction orthogonal to the direction.

Figure 23A:
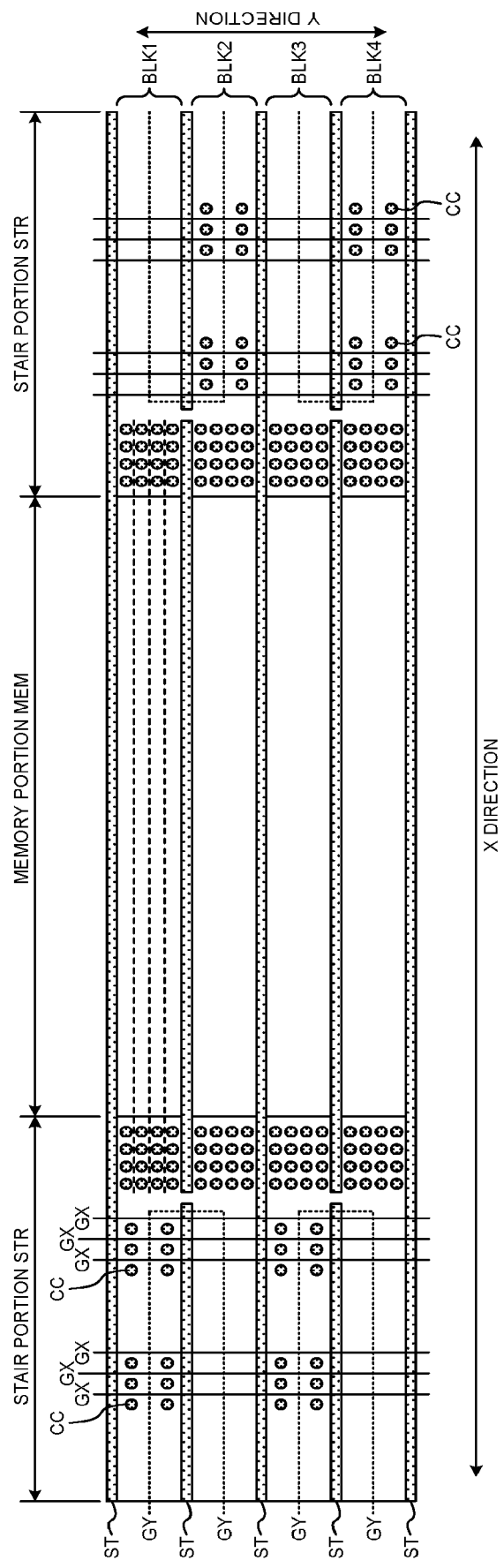

FIG. 23A and FIG. 23B are schematic views illustrating a two-row stair structure of the semiconductor storage device according to the third embodiment. FIG. 23A is a plan view illustrating the two-row stair structure, and FIG. 23B is a perspective view illustrating the two-row stair structure. FIG. 23B does not illustrate the insulating layers IL among word lines WL1 to WL6.

As illustrated in FIG. 23A, the semiconductor storage device of the third embodiment includes stair portions STR arranged on both sides of the memory portion MEM. The stair portions STR are stair portions including a dummy stair as in the stair portions STRa to STRc and STRx to STRz of the first and second embodiments. In addition, the stair portion STR has a GX stair that ascends or descends in the X direction and a GY stair that ascends or descends in the Y direction. The memory portion MEM and the stair portions STR on both the sides of the memory portion MEM are divided in the Y direction by a plurality of the slits ST extending in the X direction. The divided individual areas constitute blocks BLK1 to BLK4. Each of the blocks BLK1 to BLK4 includes the plurality of contacts CC connected to the word lines WL from the lowermost layer to the uppermost layer in the stair portion STR on one end side of the memory portion MEM. That is, for example, the block BLK1 includes the plurality of contacts CC in the stair portion STR on the left side of the drawing, and the block BLK2 includes the plurality of contacts CC in the stair portion STR on the right side of the drawing.

As illustrated in FIG. 23B, each of the individual stair portions STR in the blocks BLK1 to BLK4 are divided into two rows in the Y direction. That is, a stair portion sandwiched between the two slits ST has two rows of stairs ascending in steps toward the memory portion MEM, that is, the GX stair. In the two rows of stairs arranged in the Y direction, one forms a GY stair that is one step higher than the other, that is, one layer higher than the word line WL1. In addition, each of the stairs in the two rows ascends in steps toward the memory portion by two layers of word lines in the X direction. That is, one step is constituted by the two layers of word lines in the X direction.

As a result, a stair structure corresponding to six steps can be provided in a space corresponding to three steps of a stair portion of a one-row stair structure which is not divided in the Y direction. Further, six layers of the word lines WL1 to WL6 can be led out in a space where a layer of the word line WL3 is led out in the one-row stair structure by arranging contacts CC1 to CC6 in each of the six steps. Accordingly, the stair length can be further shortened by applying the stair portions STRa to STRc and STRx to STRz of the first and second embodiments to the two-row stair structure of the third embodiment.

Figure 24:
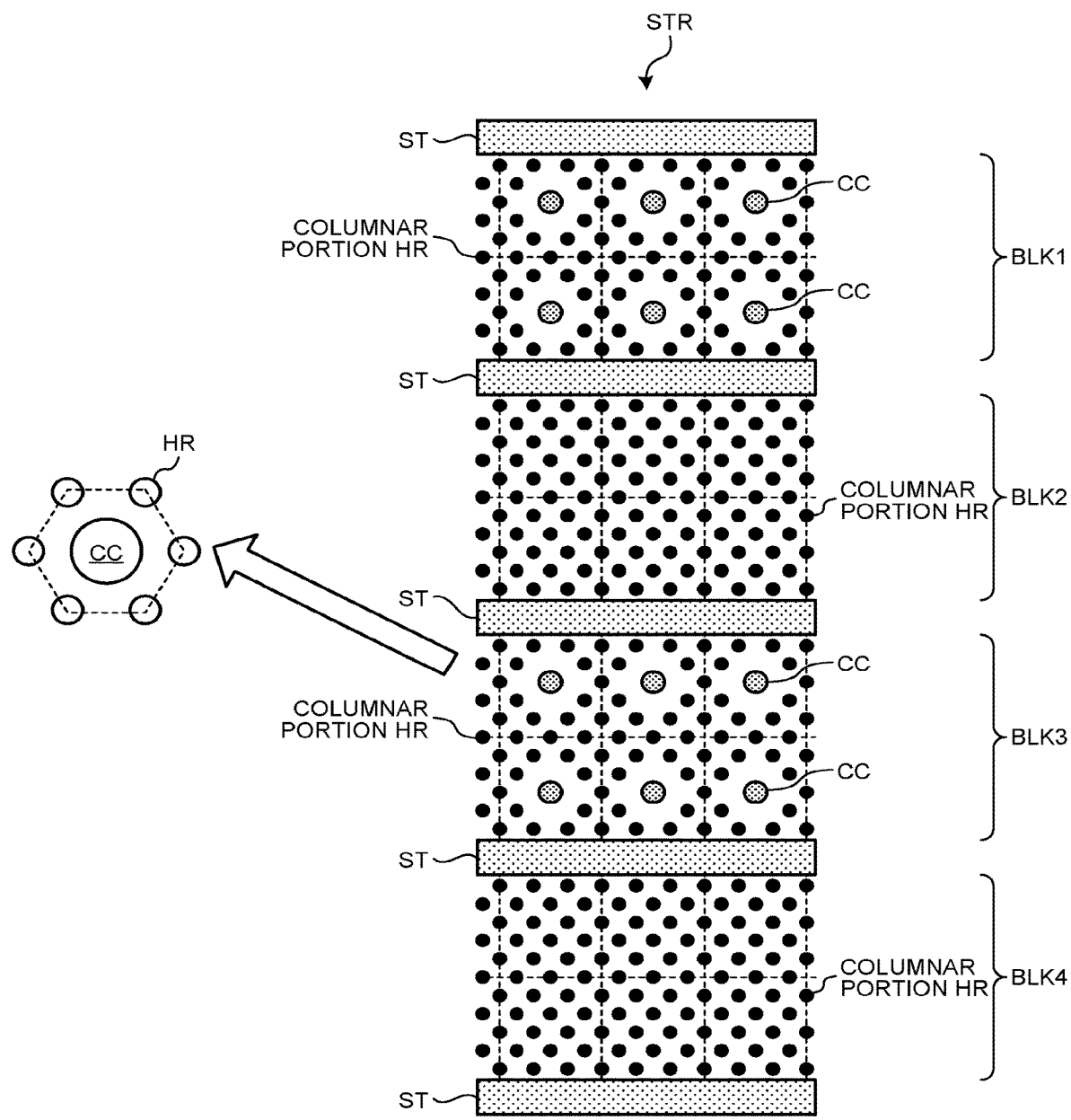
FIG. 24 is a plan view illustrating an arrangement example of a columnar portion in the two-row stair structure according to the third embodiment.

FIG. 24 is a plan view illustrating an arrangement example of the columnar portion HR in the two-row stair structure according to the third embodiment. As illustrated in FIG. 24, the columnar portions HR are arranged in a grid shape in the individual stair portions STR in the blocks BLK1 to BLK4 so as to have a high density as much as possible. Here, the columnar portions HR are arranged circumferentially around the contact CC. In other words, the columnar portion HR is arranged around the contact CC at each vertex of a regular hexagon surrounding the contact CC.

Meanwhile, a stair length becomes too long when the stair portions STRa' to STRk' (see FIG. 15A) of the above-described comparative example are applied to the above-described two-row stair structure. That is, an occupancy rate of the stair portion relative to the memory portion becomes too high. Therefore, it is conceivable to further increase the number of rows in the multi-row stair structure.

Figure 25A:
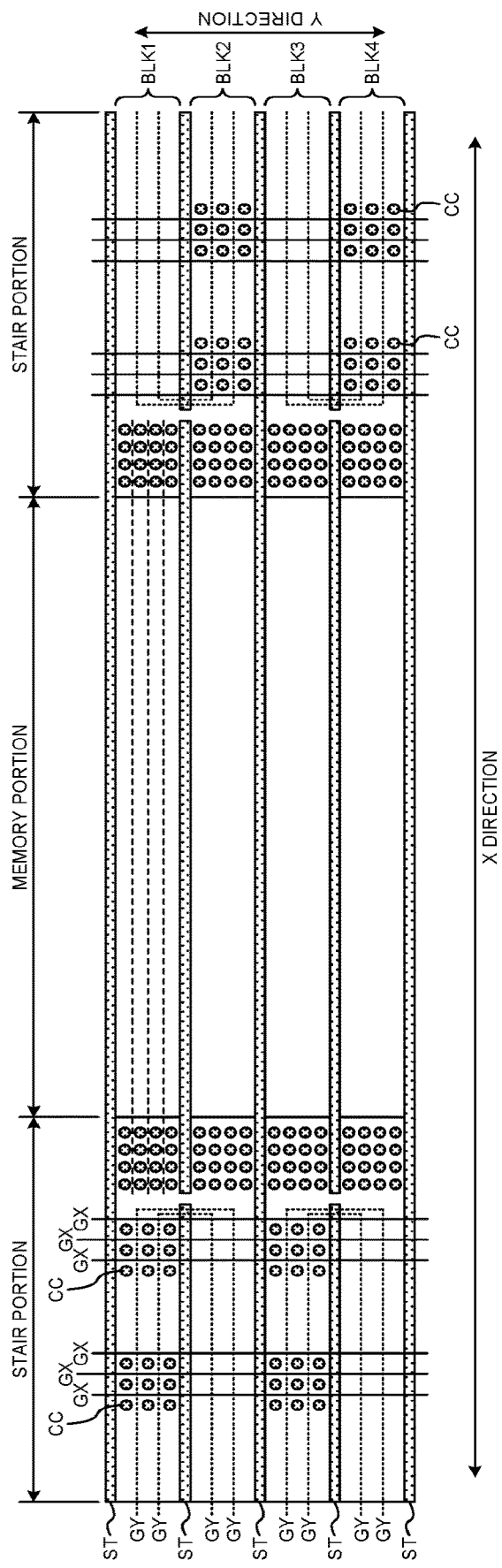

FIGS. 25A and 25B are schematic views illustrating a three-row stair structure of a semiconductor storage device according to a comparative example. FIG. 25A is a plan view illustrating the three-row stair structure, and FIG. 25B is a perspective view illustrating the three-row stair structure. FIG. 25B does not illustrate the insulating layers IL among word lines WL1 to WL9.

As illustrated in FIG. 25A, stair portions are arranged on both sides of a memory portion even in the semiconductor storage device of the comparative example. The stair portions are stair portions including many dummy stairs as in the stair portions STRa' to STRk' of the comparative example described above. In addition, the stair portion has a GX stair that ascends or descends in the X direction and a GY stair that ascends or descends in the Y direction. The memory portion and the stair portions on both the sides of the memory portion are divided in the Y direction by a plurality of the slits ST extending in the X direction to form the blocks BLK1 to BLK4. Each of the blocks BLK1 to BLK4 has a plurality of the contacts CC in the stair portion on one end side of the memory portion.

As illustrated in FIG. 25B, each stair portion in the blocks BLK1 to BLK4 is divided into three rows in the Y direction. That is, the stair portion has three rows of the GX stairs. In the example of FIG. 25B, the GY stair is formed such that a step in the middle row of an area between the two slits ST is the lowest, one row on one side thereof is one step higher, and one row on the other side thereof is two steps higher. That is, with respect to the word line WL constituting the middle row, a word line WL one layer above the word line WL forms one row on one side of the middle row, and a word line WL two layers above the word line WL forms the other one row. In addition, the stair portion in the blocks BLK1 to BLK4 ascends in steps toward the memory portion in the X direction, and one step thereof is constituted by three layers of the word lines WL3. That is, the respective stair portions ascend in steps every three layers of the word lines WL toward the memory portion in the X direction.

As a result, a stair structure corresponding to nine steps can be provided in a space corresponding to three steps of a stair portion of a one-row stair structure which is not divided in the Y direction. Further, nine layers of the word lines WL1 to WL9 can be led out by arranging contacts CC1 to CC9 in each of the nine steps. Accordingly, a stair length can be shortened by applying the stair portions STRa' to STRk' of the comparative example to this three-row stair structure. However, the issue is how to arrange columnar portions in such a configuration.

Figure 26:
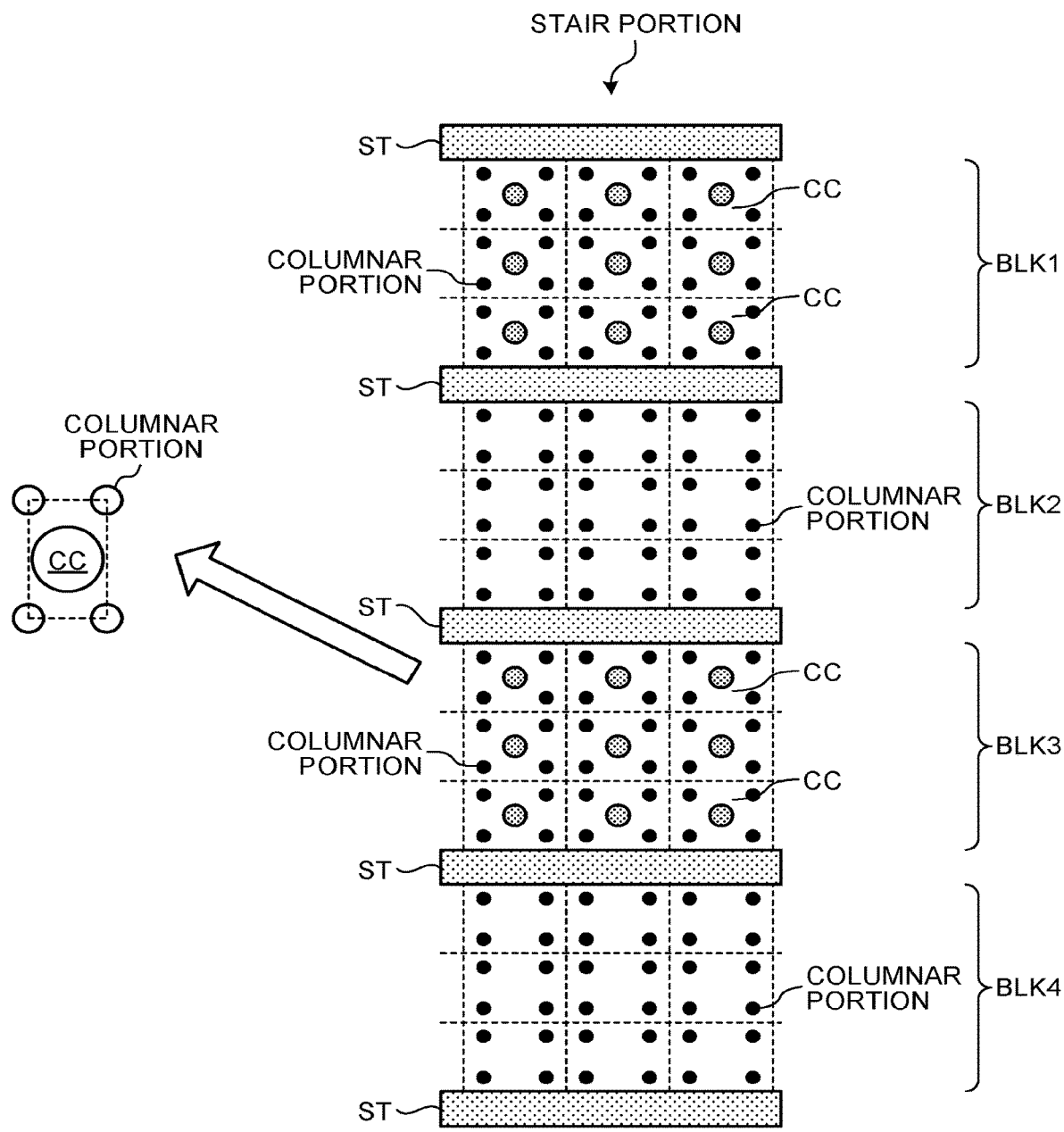
FIG. 26 is a plan view illustrating an arrangement example of a columnar portion in the three-row stair structure according to the comparative example.

FIG. 26 is a plan view illustrating an arrangement example of the columnar portion in the three-row stair structure according to the comparative example. As illustrated in FIG. 26, even if it is attempted to arrange the columnar portions with a high density as much as possible in the individual stair portions in the blocks BLK1 to BLK4, a space of each step is narrow in the three-row stair structure, and it is difficult to arrange the columnar portions with a sufficient density. That is, there is a concern that it is difficult to maintain sufficient strength in a stacked body having a gap at the time of replacement.

According to the semiconductor storage device of the third embodiment, the configurations of the first and second embodiments are applied, and thus, the two-row stair structure can be adopted. The two-row stair structure has a space for arranging the columnar portions HR with a sufficiently high density in each step. As a result, the strength of the stacked body LMg can be sufficiently maintained even at the time of replacement.

According to the semiconductor storage device of the third embodiment, the columnar portions HR are arranged circumferentially around the contact CC which does not play a role as a fulcrum. Thus, the stacked body LMg can be more firmly maintained at the time of replacement.

According to the semiconductor storage device of the third embodiment, the configurations of the first and second embodiments are applied to the multi-row stair structure. As a result, the stair length can be further shortened, and the ratio of the stair portion STR relative to the memory portion MEM can be suppressed.

Other Embodiments

Although the insulating layers IL and the word lines WL constituting the stair portions STRb and STRy and the insulating layers IL and the word lines WL constituting the stair portions STRa and STRx do not overlap each other in the first and second embodiments described above, the both may partially overlap each other. That is, the dropping amount of the stair portions STRb and STRy may be reduced. It is also possible to adopt such a configuration in view of the layout of the stair portions STRa to STRc and the stair portions STRx to STRz although the invalid area IV is increased since the stacking positions overlap between the stair portions STRa and STRb or between the stair portions STRx and STRy.

In the first and second embodiments described above, the peripheral circuit PER is arranged between the memory portion MEM and the substrate 10, but the present invention is not limited thereto. The peripheral circuit may be arranged, for example, at the same height as the memory portion outside the memory portion. In this case, the memory portion may be arranged directly on the substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising a stacked body in which a plurality of conductive layers are alternately stacked in a first direction with an insulating layer interposed therebetween,
    wherein the stacked body includes:
    a plurality of pillars arranged to extend in the first direction of the stacked body;
    a first stair portion which is formed in a stair shape such that a first conductive layer group out of the conductive layers descends in a second direction that is a direction away from the pillar, and has a plurality of steps, one step formed of a terrace surface and a step surface extending in a third direction intersecting the first direction and the second direction;
    a second stair portion which is formed in a stair shape such that a second conductive layer group out of the conductive layers descends in the second direction, and has a plurality of steps, one step formed of a terrace surface and a step surface extending in the third direction; and
    a third stair portion which is provided to face the first stair portion, is formed in a stair shape such that a third conductive layer group out of the conductive layers ascends in the second direction, and has a plurality of steps, one step formed of a terrace surface and a step surface extending in the third direction,
    the second conductive layer group is located below the first conductive layer group in the first direction, the third conductive layer group is located at a position identical to the first conductive layer group in the first direction,
    the number of conductive layers included in the first conductive layer group of the first stair portion is equal to the number of conductive layers included in the third conductive layer group of the third stair portion, and
    a distance from an upper end of an uppermost step surface of the first stair portion to an upper end of a lowermost step surface of the first stair portion at a position identical to the upper end in the third direction is longer than a distance from an upper end of an uppermost step surface of the third stair portion to an upper end of a lowermost step surface of the third stair portion at a position identical to the upper end in the third direction.

2. The semiconductor storage device according to claim 1, wherein
    the plurality of pillars are provided in a memory portion, and the memory portion includes a plurality of memory cells provided at respective intersections with each of the pillars and the plurality of conductive layers, and
    the first stair portion, the third stair portion, and the second stair portion are arranged in order from a side closer to the memory portion.

3. The semiconductor storage device according to claim 1, wherein
    the number of the conductive layers forming one step of the third stair portion is larger than the number of the conductive layers constituting one step of the first stair portion.

4. The semiconductor storage device according to claim 1, wherein
    the number of the conductive layers forming one step in the first stair portion and the second stair portion is one.

5. The semiconductor storage device according to claim 1, wherein
    the number of steps in the third stair portion is smaller than the number of steps in the first stair portion.

6. The semiconductor storage device according to claim 1, wherein
    a plurality of memory cells are provided at intersections between the plurality of conductive layers and the plurality of pillars, and
    the conductive layers forming the first stair portion and the second stair portion are connected to the memory cells.

7. The semiconductor storage device according to claim 1, wherein
    the conductive layer forming the third stair portion is in an electrically floating state.

8. The semiconductor storage device according to claim 1, further comprising
    a plurality of contacts that connect the conductive layers forming the respective steps and an upper layer wiring are arranged at the respective steps of the first stair portion and the respective steps of the second stair portion.

9. The semiconductor storage device according to claim 1, further comprising
    a connection portion in which a conductive layer directly below a lowermost conductive layer of the first stair portion and a conductive layer directly above an uppermost conductive layer of the second stair portion are connected to each other, the connection portion provided between the first stair portion and the third stair portion.

10. The semiconductor storage device according to claim 1, wherein
    a width of a terrace surface of a first step of the first stair portion is equal to a width of a terrace surface of a second step provided at a height identical to the first step in the third stair portion.

11. A semiconductor storage device comprising:
    a first stacked body in which a plurality of first conductive layers are alternately stacked with an insulating layer interposed therebetween;

a second stacked body in which a plurality of second conductive layers are alternately stacked on a part of the first stacked body with an insulating layer interposed therebetween; and a third stacked body in which a plurality of third conductive layers are alternately stacked on the first stacked body with an insulating layer interposed therebetween on a part of an area where the second stacked body is not provided, wherein the second stacked body includes a plurality of pillars extending in a stacking direction of the second stacked body in the second stacked body, and a first stair portion in which the second conductive layers provided in the second stacked body are formed in a stair shape, the first stacked body includes a plurality of pillars extending in a stacking direction of the first stacked body in the first stacked body, and a second stair portion in which the first conductive layers lower than the conductive layers forming the first stair portion are formed in a stair shape, the third stacked body includes a third stair portion in which the third conductive layers are formed in a stair shape to face the first stair portion, an upper surface of the third stacked body located at a position identical to an upper surface of the second stacked body in the stacking direction, and the number of the first conductive layers included in one step in the first stair portion is smaller than the number of the third conductive layers included in one step in the third stair portion.

12. The semiconductor storage device according to claim 11, wherein
a plurality of memory cells are provided at intersections between the plurality of conductive layers and the plurality of pillars, and the conductive layers forming the first stair portion and the second stair portion are connected to the memory cell.

13. The semiconductor storage device according to claim 11, wherein
the third conductive layer forming the third stair portion is in an electrically floating state.

14. The semiconductor storage device according to claim 11, further comprising
a plurality of contacts that connect the conductive layers forming the respective steps and an upper layer wiring are arranged at the respective steps of the first stair portion and the respective steps of the second stair portion.

15. The semiconductor storage device according to claim 11, further comprising
a connection portion in which a conductive layer directly below a lowermost conductive layer of the first stair portion and a conductive layer directly above an uppermost conductive layer of the second stair portion are connected to each other, the connection provided between the first stair portion and the third stair portion.

16. The semiconductor storage device according to claim 11, wherein
a width of a terrace surface of a first step of the first stair portion is equal to a width of a terrace surface of a second step provided at a height identical to the first step in the third stair portion.

17. A method for manufacturing a semiconductor storage device, the method comprising:
forming a stacked body in which a plurality of first layers are stacked on each other with a second layer interposed therebetween;

forming a first stair portion in which a third layer group out of the plurality of first layers in an upper layer part of the stacked body is formed in a stair shape;

forming a second stair portion in which a fourth layer group, located at a stacking position identical to the third layer group, out of the plurality of first layers is formed in a stair shape;

forming a third stair portion between the first stair portion and the second stair portion such that the fourth layer group is formed in a stair shape and is arranged to face the first stair portion;

a first process of extending the first stair portion to a lower layer part of the stacked body while retracting a position of an uppermost step relative to a lowermost step of the first stair portion;

a second process of extending the second stair portion to the lower layer part of the stacked body while retracting a position of an uppermost step relative to a lowermost step of the second stair portion;

a third process of extending the third stair portion to the lower layer part of the stacked body without retracting a position of an uppermost step relative to a lowermost step of the third stair portion; and a process of etching the second stair portion in a stacking direction of the stacked body while maintaining a difference in level of the second stair portion to form a fourth stair portion in which a fifth layer group, lower than the third layer group, out of the plurality of first layers is formed in a stair shape.

18. The method for manufacturing a semiconductor storage device according to claim 17, wherein
the first process, the second process, and the third process are implemented using a resist pattern covering at least a terrace surface between the second stair portion and the third stair portion as a mask, an end of the resist pattern at a side of the second stair portion is arranged at a position retracted toward the third stair portion by a predetermined distance from a step surface of the uppermost step of the second stair portion, and an end of the resist pattern at a side of the third stair portion is arranged at a position overlapping a step surface of the lowermost step of the third stair portion.

19. The method for manufacturing a semiconductor storage device according to claim 18, wherein
the first process, the second process, and the third process are implemented while slimming the resist pattern a plurality of times.

20. The method for manufacturing a semiconductor storage device according to claim 19, wherein
the first process, the second process, and the third process include a plurality of cycles, the cycle including a plurality of times of slimming of the resist pattern.

* * * * *